(12) United States Patent
Nose et al.

(10) Patent No.: US 8,242,814 B2
(45) Date of Patent: Aug. 14, 2012

(54) CLOCK GENERATING CIRCUIT AND CLOCK GENERATING METHOD

(75) Inventors: Koichi Nose, Tokyo (JP); Masayuki Mizuno, Tokyo (JP); Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 667 days.

(21) Appl. No.: 11/575,168

(22) PCT Filed: Sep. 16, 2005

(86) PCT No.: PCT/JP2005/017166
§ 371 (c)(1),
(2), (4) Date: Mar. 13, 2007

(87) PCT Pub. No.: WO2006/030905
PCT Pub. Date: Mar. 23, 2006

(65) Prior Publication Data
US 2008/0018372 A1    Jan. 24, 2008

(30) Foreign Application Priority Data
Sep. 17, 2004    (JP) ................................ 2004-270742

(51) Int. Cl.
*H03B 19/00*    (2006.01)
(52) U.S. Cl. .......................... 327/116; 327/119; 327/294
(58) Field of Classification Search .................. 327/231, 327/113, 114, 116, 119, 291, 293, 294, 298
See application file for complete search history.

(56) References Cited

U.S. PATENT DOCUMENTS

| | | | | |
|---|---|---|---|---|
| 5,463,337 A * | 10/1995 | Leonowich | ................... | 327/158 |
| 5,841,325 A | 11/1998 | Knotts et al. | | |
| 5,955,902 A * | 9/1999 | Takada et al. | ................. | 327/116 |
| 6,005,420 A * | 12/1999 | Yoshizawa et al. | ........... | 327/116 |
| 6,147,525 A * | 11/2000 | Mitani et al. | ................... | 327/119 |
| 6,150,855 A * | 11/2000 | Marbot | ......................... | 327/116 |
| 6,295,328 B1 | 9/2001 | Kim et al. | | |
| 6,441,659 B1 | 8/2002 | Demone | | |
| 6,900,684 B2 * | 5/2005 | Kozaki | .......................... | 327/264 |
| 7,173,466 B2 | 2/2007 | Chiba et al. | | |

FOREIGN PATENT DOCUMENTS

| | | |
|---|---|---|
| JP | 10-294649 A | 11/1998 |
| JP | 10-335991 A | 12/1998 |
| JP | 11-261408 A | 9/1999 |
| JP | 2001-209454 A | 8/2001 |
| JP | 2001-217682 A | 8/2001 |
| JP | 2002-043904 A | 2/2002 |
| JP | 2002-543732 T | 12/2002 |
| JP | 2003-229763 A | 8/2003 |

* cited by examiner

*Primary Examiner* — Hai L Nguyen
(74) *Attorney, Agent, or Firm* — Dickstein Shapiro LLP

(57) ABSTRACT

A clock converting circuit (1) receives and then converts m-phase clocks of a frequency f having a phase difference of $1/(f \times m)$ to n-phase clocks of the frequency f having a phase difference of $1/(f \times n)$. A single-phase clock generating circuit (2) receives the n-phase clocks of the frequency f having a phase difference equivalent time of $1/(f \times n)$ to generate single-phase clocks in synchronism with the rising or falling edges of the n-phase clocks. Since the frequency of the m-phase clocks inputted to the clock converting circuit (1) is 'f', if a desired frequency of the single-phase clocks is decided, then 'n' can be obtained from the equation: the frequency of the single-phase clocks is equal to $(f \times n)$. This value of 'n' is set to the clock converting circuit (1), thereby obtaining the n-phase clocks of the frequency f from the m-phase clocks of the frequency f to provide single-phase clocks of a desired frequency.

18 Claims, 23 Drawing Sheets

CLOCK GENERATING CIRCUIT AND CLOCK GENERATING METHOD

APPLICABLE FIELD IN THE INDUSTRY

The present invention relates to a clock generating circuit and a clock generating method, and more particularly to a clock generating circuit for employing a multi-phase clock, thereby to generate a clock of a desired frequency, and a clock generating method for the same.

BACKGROUND ART

Conventionally, as the circuit for generating clocks of a plurality of different frequencies, the circuit is known for employing a PLL (Phase Locked Loop) circuit etc. to produce the clock of which the frequency is a least common multiple thereof, and to de-multiply it by an appropriate ratio, thereby to generate a clock signal of a desired frequency. On the other hand, in some cases, coexistence of many kinds of frequencies is necessitated, depending upon the circumstances of various specifications or the like.

In such a case, in a prior art, the clocks of many kinds of frequencies are obtained by preparing a clock signal of a high frequency to de-multiply it. For example, in a case where clocks of 400 MHz and 500 MHz are required, a clock of which the frequency is 2 GHz, being a least common multiple thereof, is generated, and this clock of 2 GHz is de-multiplied by five and four, thereby to generate the clock of 400 MHz and the clock of 500 MHz, respectively.

The circuit for generating the clock of 2 GHz, however, is very difficult to realize, for example, by means of a device such as a CMOS of 0.4 μm. For this, there is a necessity for independently having the PLL circuit of 400 MHz and the PLL circuit of 500 MHz, respectively. This gives rise to a defect of incurring occurrence of interference between the PLL circuit companions, an increase in a consumption of the electric current due to having two PPL circuits, an augment in an layout size, or the like.

In addition hereto, switching the operational frequency with the PLL circuit requires a switching time of several to several hundreds of μs, which gives rise to a defect that an operation of the clock circuit becomes unstable during its time.

Thereupon, the clock generating circuit that can obtain an output of the clock of a desired frequency without incurring an increase in both consumption electric power and chip size has been proposed (For example, Patent document 1).

The clock generating circuit described in this patent document 1, as shown in FIG. 22, is configured of a multi-phase clock generating circuit 110 which generates a multi-phase clock of a fixed frequency from a single-phase clock, pulse generating circuits 120-1 to 120-$n$ which generate non-overlapped pulses p0 to pn each of which does not overlap with the other by using one part of the multi-phase clock generated by the multi-phase clock generating circuit 110, and an or circuit 130 which computes a logical sum of a plurality of non-overlapped pulses p0 to pn produced by the pulse generating circuits 120-1 to 120-$n$.

Upon explaining an actual operation, in a case of producing, for example, an eight-phase clock signal of a frequency of 250 MHz by the multi-phase clock generating circuit 110, the frequency of the clock, which is obtained by selecting the pulses that are obtained from the pulse generating circuits 120-1 to 120-$n$ without causing them to overlap with each other, becomes 2 GHz, 1 GHz, 666 MHz, 500 MHz . . . .

Patent document 1: JP-P2001-209454A

DISCLOSURE OF THE INVENTION

Problems to be Solved by the Invention

The technology of the foregoing patent document 1, however, is not capable of generating the frequencies ranging 2 GHz to 1 GHz, and the next highest frequency that is obtained from the multi-phase clock signal is a half of the highest frequency.

Further, as is often the case, most circuits, which have no chance to operate by one clock, are employed, as a rule, together with a certain reference clock, and in this case, a coincidence with a timing of the reference clock is required.

However, the foregoing technology, which has no function of allowing the timing of the circuit to coincide with that of other clock signal, necessitates the circuit for performing a phase correction additionally, which incurs an increase in the circuit size.

Thereupon, the present invention has been accomplished in consideration of the above-mentioned problems, and an object thereof is to provide a clock generating circuit that enables single-phase clocks of many kinds of the frequencies to be obtained from one kind of the multi-phase clock, and its method.

Further, an object of the present invention is to provide a clock generating circuit that is small in size and low in consumption electric power, and yet enables the clock generation time to be reduced, and its method.

Yet further, an object of the present invention is to provide a clock generating circuit that allows a further reduction in the circuit size to be realized by causing the clock generating circuit to serve as a function of correcting a timing lag with a predetermined clock and a function of generating the clock, and its method.

Means to Solve the Problem

The first invention for accomplishing the above-mentioned object of the present invention, which is a clock generating circuit, is characterized in including: a clock converting circuit for converting an m-phase clock of a frequency f into an n-phase clock of a frequency f; and a single-phase clock generating circuit for employing at least one part of each clock of the n-phase clock, thereby to generate a single-phase clock signal.

The second invention for accomplishing the above-mentioned object of the present invention, which is a clock generating circuit, is characterized in including: a clock converting circuit for converting an m-phase clock signal of an identical frequency f of which a phase-difference-equivalent time differs every 1/(f×m) into an n-phase clock signal of an identical frequency f of which a phase-difference-equivalent time differs every 1/(f×n); and a single-phase clock generating circuit for employing one part or all of the n-phase clock signal, thereby to generate a single-phase clock signal of a frequency (f×n)/A (A is a natural number).

The third invention for accomplishing the above-mentioned object of the present invention, which is a clock generating circuit, is characterized in including: a clock converting circuit for converting an m-phase clock signal of a frequency f of which a phase-difference-equivalent time differs every 1/(f×m) into an n-phase clock signal of a frequency f of which a phase-difference-equivalent time differs every 1/(f×n); and a single-phase clock generating circuit for producing pulses each of which does not overlap with the other in synchronism with a rising or falling edge of the n-phase clock, selecting every (X+1)-th pulse out of these pulses, computing a logical sum of the selected pulses, and generating a single-phase clock signal of a frequency (f×n)/(X+1)(X is a natural number).

The fourth invention for accomplishing the above-mentioned object of the present invention is characterized in that, one of the above-mentioned first invention to third invention: the clock converting circuit includes at least n phase interpolators; and each the phase interpolator is configured to input two clocks of the m-phase clock each having a different phase, and to output a clock of a delay time that is specified by a time obtained on dividing a timing difference of the two clocks by a predetermined interior division ratio (a:b, a+b=n), thus making the interior division ratio variable.

The fifth invention for accomplishing the above-mentioned object of the present invention is characterized in, in one of the above-mentioned first invention to fourth invention, including a controlling circuit for controlling an interior division ratio that is provided in the phase interpolator.

The sixth invention for accomplishing the above-mentioned object of the present invention is characterized in that, in the above-mentioned fifth invention, the controlling circuit is configured to control the predetermined interior division ratio so that a timing of a reference clock and that of the single-phase clock coincide with each other, based upon a time equivalent to a phase difference of the reference clock and the clock distributed in an end of the circuit for which the single-phase clock has been supplied.

The seventh invention for accomplishing the above-mentioned object of the present invention, which is a clock generating circuit, is characterized in: including: a clock converting circuit for converting an m-phase clock signal of a frequency f of which a phase-difference-equivalent time differs every 1/(f×m) into a n-phase clock signal of a frequency f of which a phase-difference-equivalent time differs every 1/(f×n); and a single-phase clock generating circuit for generating a single-phase clock signal of a frequency (f×n) from the n-phase clock signal; that the clock converting circuit includes m phase interpolators each of which is configured to input two clocks of the m-phase clock each having a different phase, and to output a clock of a delay time that is specified by a time obtained on dividing a timing difference of the two clocks by a predetermined interior division ratio (a:b, a+b=n), thus making the interior division ratio variable; and that the single-phase clock generating circuit includes: n pulse generators for producing pulses each of which does not overlap with each other at a timing of a rising or falling edge of the n-phase clock output from the clock converting circuit; and a logical circuit for computing a logical sum of the pulses produced by the pulse generators to generate a single-phase clock of a frequency (f×n).

The eighth invention for accomplishing the above-mentioned object of the present invention is characterized in, in the above-mentioned seventh invention, including a controlling circuit for controlling an interior division ratio that is provided in the phase interpolator.

The ninth invention for accomplishing the above-mentioned object of the present invention is characterized in that, in the above-mentioned eighth invention, the controlling circuit is configured to control the predetermined interior division ratio so that a timing of a reference clock and that of the single-phase clock coincide with each other, based upon a time equivalent to a phase difference of the reference clock and the clock distributed in an end of the circuit for which the single-phase clock have been supplied.

The tenth invention for accomplishing the above-mentioned object of the present invention, which is an integrated circuit, is characterized in: including: at least one circuit board; and one of the clock generating circuits of the above-mentioned first to ninth inventions that is provided correspondingly to the circuit board; and that the m-phase clock that is input into the clock generating circuit is an identical clock.

The eleventh invention for accomplishing the above-mentioned object of the present invention, which is a clock generating method, is characterized in converting an m-phase clock of a frequency f into an n-phase clock of a frequency f, producing pulses in synchronism with a rising or falling edge of each clock of the n-phase clock, computing a logical sum of these pulses, and generating a single-phase clock of a frequency (f×n).

The twelfth invention for accomplishing the above-mentioned object of the present invention is characterized in, in the above-mentioned eleventh invention, in selecting n pairs from the m-phase clock with two clocks each having a different phase assumed to be one pair, and generating a clock of a delay time that is specified by a time obtained on dividing a timing difference of the two clocks by a predetermined interior division ratio (a:b, a+b=n) pair by pair, thereby to generate an n-phase clock.

The clock generating circuit of the present invention, as shown in FIG. 1, is configured of a clock converting circuit 1 and a single-phase clock generating circuit 2.

The clock converting circuit 1, which is a circuit for, with an m-phase (m is a natural number) clock of a frequency f assumed to be an input, converting this into an n-phase (n is a natural number) clock of a frequency f, is configured so that n can be changed freely with the n-phase clock into which m-phase clock is converted. Herein, the so-called m-phase clock of a frequency f, as shown in FIG. 2, is a clock of which the phase-difference-equivalent time increases every 1/(f×m), to begin with a phase 0°. Likewise, the n-phase clock of a frequency f, as shown in FIG. 2, is a clock of which the phase-difference-equivalent time increases every 1/(f×n), to begin with a phase 0°.

The single-phase generating circuit 2 generates a single-phase clock in synchronism with a rising or falling edge of the n-phase clock of a frequency f.

An operation in such a configuration will be explained.

When the m-phase clock of a frequency f having a phase difference of 1/(f×m) is input into the clock converting circuit 1, it is converted into a n-phase clock of a frequency f having a phase difference of 1/(f×n). Herein, n is decided depending upon the desired frequency of the single-phase clock, which will be described later.

The n-phase clock, of which the phase-difference-equivalent time is 1/(f×n), and of which the frequency is f is input into the single-phase clock generating circuit 2, which generates the single-phase clock in synchronism with a rising or falling edge of each n-phase clock. In FIG. 2, the single-phase clock in synchronism with the rising edge of each n-phase clock is shown. The frequency of this single-phase clock, which is (f×n), is decided by a time 1/(f×n) equivalent to a phase difference of the n-phase clock.

Upon deciding a desired frequency of the single-phase clock, then n can be obtained from the equation: the required frequency of the single-phase clock=(f×n) because the frequency of the m-phase clock that is input into the clock converting circuit 1 is f. And, setting this n to the clock converting circuit 1 enables the n-phase clock of the frequency f to be obtained from the m-phase clock of the frequency f, and the single-phase clock of a desired frequency to be obtained.

Additionally, in FIG. 2, an example was shown of generating the single-phase clock of a frequency (f×n) with a time period of the rising of each n-phase clock assumed to be one cycle; however it is also possible to generate the single-phase clock of a frequency (f×n)/2 with a time period of the rising of each n-phase clock assumed to be a half cycle depending upon a configuration. Further, by selecting parts of the n-phase clock, for example, at an interval of an arbitrary number so that they do not overlap with each other, it is also possible to generate the single-phase clock of a frequency (f×n)/A (A is a natural number).

Effects of the Invention

The present invention is configured so that one kind of the m-phase clock is converted into the n-phase clock according to the desired frequency of the single-phase clock, and the single-phase clock of the desired frequency is generated in synchronism with the rising or falling edge of each clock of this n-phase clock, whereby the single-phase clock of many kinds of frequencies can be obtained as compared with the case of generating the single-phase clock by employing the de-multiplier, or employing the multi-phase clock of one kind of the frequency, which is a conventional generation method.

Further, the present invention does not necessitate the complicate control circuit that stores an operational state in order to generate the single-phase clock of the desired frequency, thereby allowing the smaller size and the lower consumption electric power to be realized.

Further, in the present invention, there are provided at least n phase interpolators as the circuit for converting m-phase clock, each of which is configured to input two clocks of the m-phase clock each having a different phase, and to output a clock of a delay time that is specified by a time obtained on dividing a timing difference of the two clocks by a predetermined interior division ratio (a:b, a+b=n), thus making the interior division ratio variable, whereby there is no necessity for a feedback control, and the n-phase clock can be momentarily obtained from the m-phase clock to obtain the single-phase clock of a desired frequency.

Further, in accordance with the present invention, switching the value of n enables the frequency of the clock to be switched in a time period of several cycles.

Further, in accordance with the present invention, there is no necessity for taking operational stability at the time of the feedback into consideration, and the stable operation can be guaranteed at any time, differently from the case of the conventional frequency transform by the PLL, whereby the design is made more easily.

Further, in accordance with the present invention, at least the foregoing n phase interpolators have a correction function of allowing the timing of the circuit to coincide with that of some clock that becomes a reference, respectively, whereby a larger reduction in the circuit size can be realized as compared with the case of the prior art in which the correction function is separately provided.

DESCRIPTION OF NUMERALS 1 clock converting circuit
2 single-phase clock generating circuit
3 controlling circuit
$11_1$ to $11_8$ phase interpolators
$21_1$ to $21_8$ pulse generators

BEST MODE FOR CARRYING OUT THE INVENTION

Figure 1:
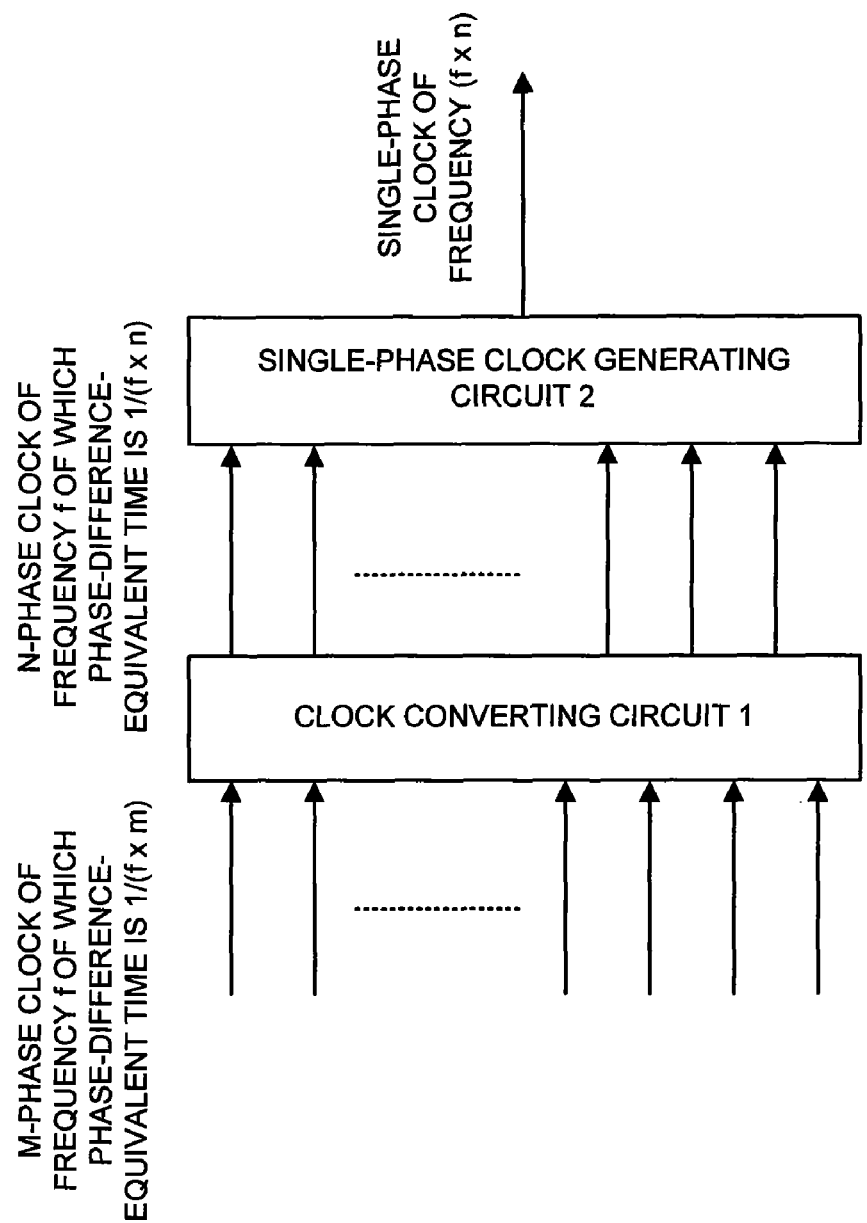
FIG. 1 is a view for explaining an outline of the clock generating circuit of the present invention.
Figure 2:
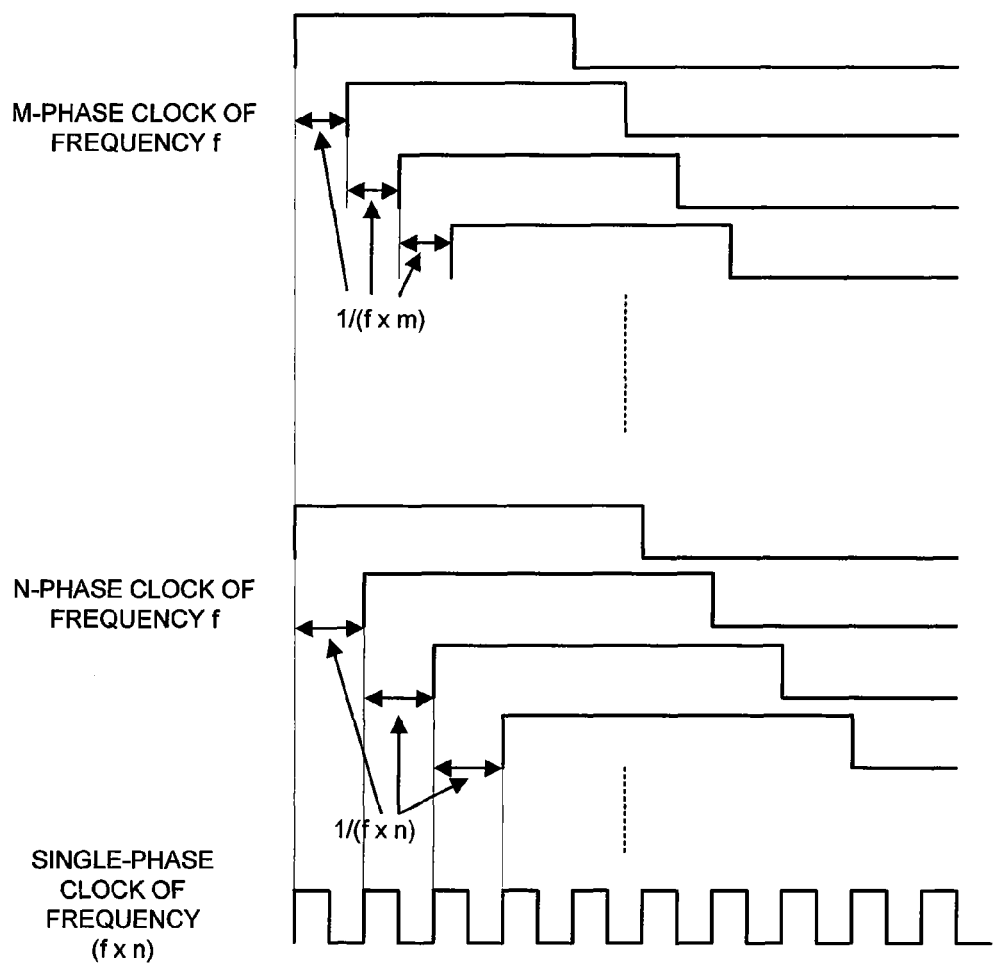
FIG. 2 is a view for explaining an outline of the clock generating circuit of the present invention.
Figure 3:
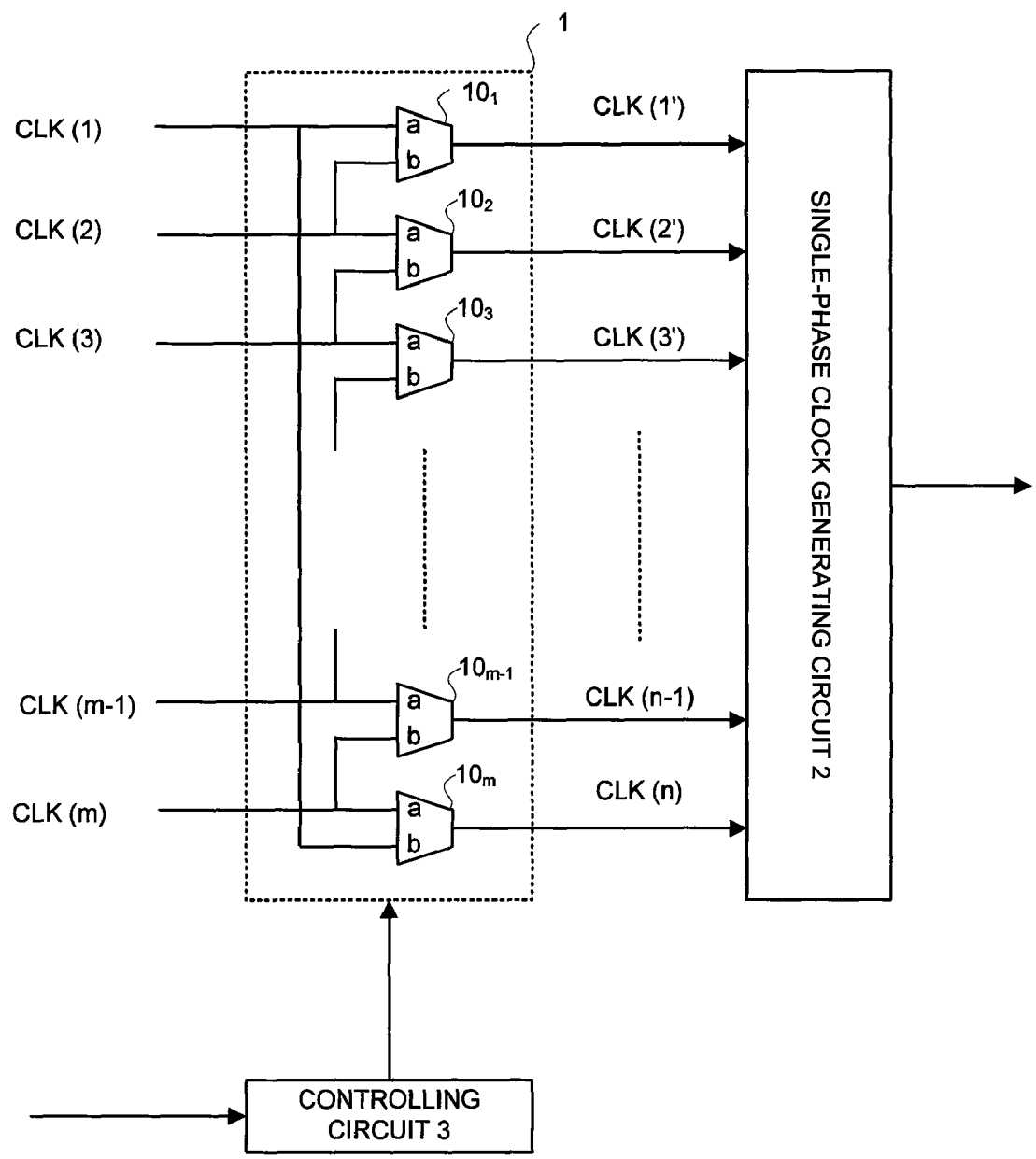
FIG. 3 is a view illustrating a configuration of the clock generating circuit in an embodiment.

An embodiment of the present invention will be explained.
FIG. 3 is a view illustrating a configuration of the clock generating circuit in the embodiment.

The clock generating circuit includes a clock converting circuit 1 for, with the m-phase (m is a natural number) clock of a frequency f assumed to be an input, converting this into the n-phase (n is a natural number) clock of a frequency f, a single-phase clock generating circuit 2 for generating the single-phase clock in synchronism with the rising edge of the n-phase clock of a frequency f, and a controlling circuit 3 for giving the clock converting circuit 1 an instruction for the phase number n of the multi-phase clock into which the m-phase clock is converted in order to obtain the single-phase clock of a desired frequency.

Figure 4:
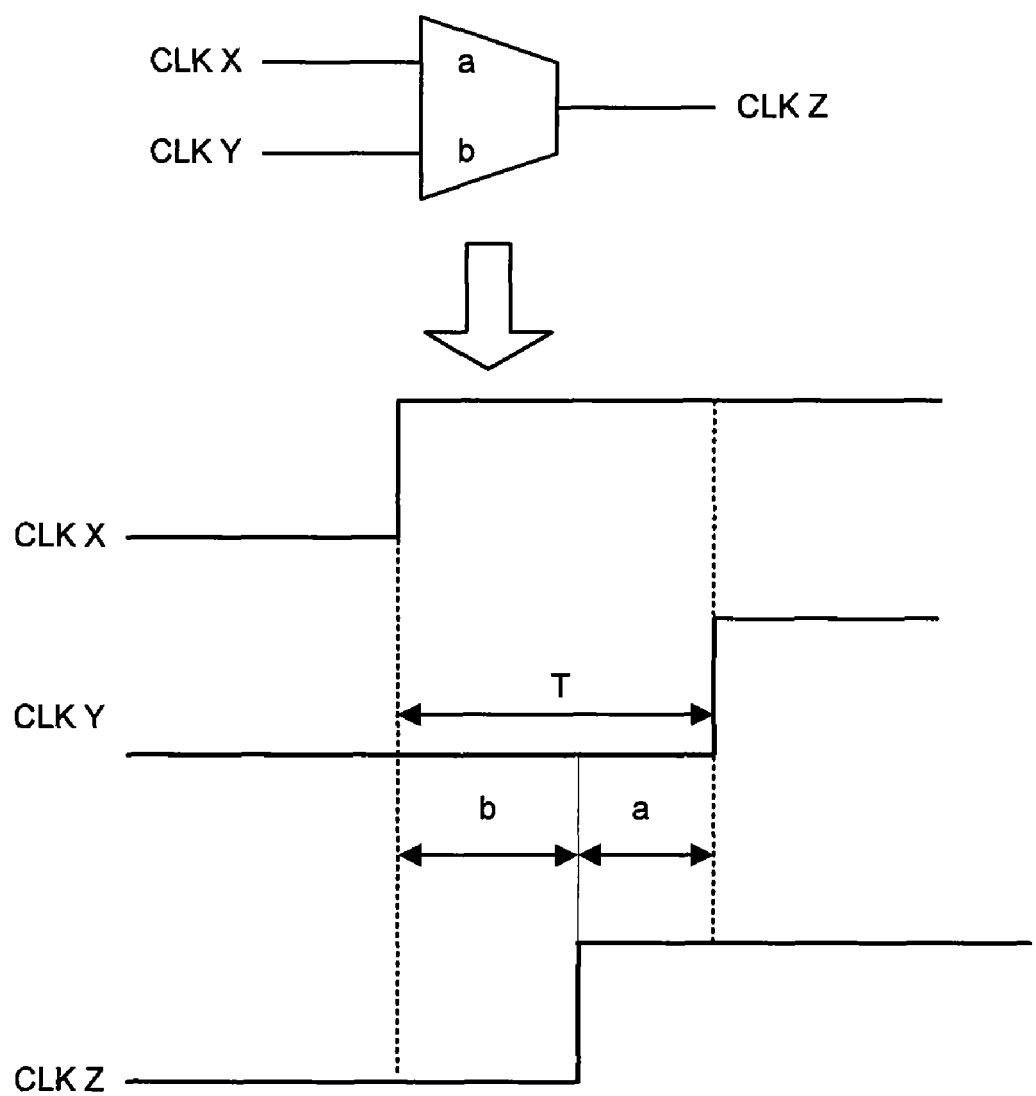
FIG. 4 is a view for explaining phase interpolators $10_1$ to $10_m$.

The clock converting circuit 1 is for, with the m-phase clocks CLK (1) to CLK (m) assumed to be an input, converting these clocks CLK (1) to CLK (m) into the n-phase clocks CLK (1') to CLK (n) that are decided responding to the desired frequency of the single-phase clock. This clock converting circuit 1 includes m phase interpolators $10_1$ to $10_m$, two clocks each having a different phase are input into each of the m phase interpolators $10_1$ to $10_m$, and one clock having a predetermined phase is output by these two clocks. For example, the clock CLK (1) and the clock CLK (2) each having a different phase are input into the phase interpolators $10_1$, and the clock CLK (1') is output. Each of the phase interpolators $10_1$ to $10_m$, which is given a setting value a and a setting value b (a+b=n) by the controlling circuit 3, as shown in FIG. 4, outputs a clock CLK (X) of a delay time that is specified by a time obtained on dividing a time difference T equivalent to a phase difference of a first input signal CLK (k) and a second input signal CLK (k+1) by (b:a).

The controlling circuit 3 controls the setting value a and the setting value b of each of the phase interpolators $10_1$ to $10_m$ so that, upon assuming that the desired frequency of the single-phase clock is fa, a time, being 1/fa, equivalent to a phase difference between each of the n-phase clocks CLK (1') to CLK (n) and the other behaves like 1/fa=1/(f×n), and causes the clock converting circuit 1 to generate the n-phase clocks CLK (1') to CLK (n).

Figure 5:
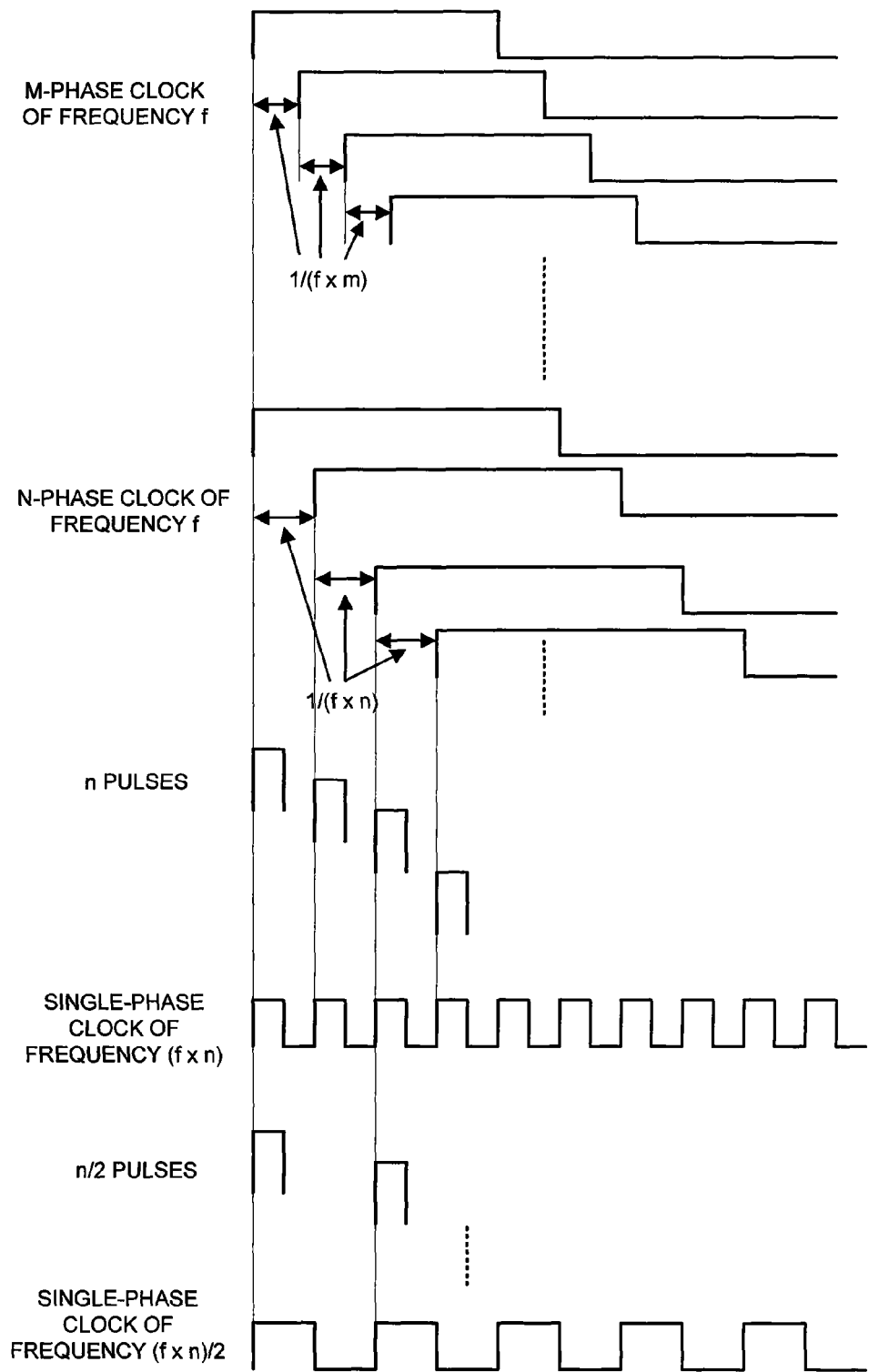
FIG. 5 is a view for explaining an operation in the embodiment.

As shown in FIG. 5, the single-phase clock generating circuit 2, with the n-phase clocks CLK (1') to CLK (n) assumed to be an input, produces the pulses in synchronism with the rising or falling edge of each of the n-phase clocks CLK (1') to CLK (n), and computes a logical sum of these pulses, thereby to generate the single-phase clock.

Additionally, it is also possible to generate the single-phase clock of which the frequency is (f×n)/(X+1) by selecting every (X+1)-th pulse out of the n produced pulses without causing them to overlap with each other, and computing a logical sum of these selected pulses. The example shown in FIG. 5 is an example in which by selecting every other pulse out of the n produced pulses without causing them to overlap with each other, and computing a logical sum of these selected pulses, the single-phase clock of which the frequency is (f×n)/(1+1)=(f×n)/2 is generated.

This embodiment makes it possible to generate the clocks of many kinds of frequencies from one kind of the multi-phase clock as compared with the conventional technology. Further, even in a case of changing the frequency of the clock that is to be generated, the frequency can be changed momentarily only by changing the value of each phase interpolator because no feedback control for changing the frequency is required.

Hereinafter, specific examples of the present invention will be explained.

Example 1

Figure 6:
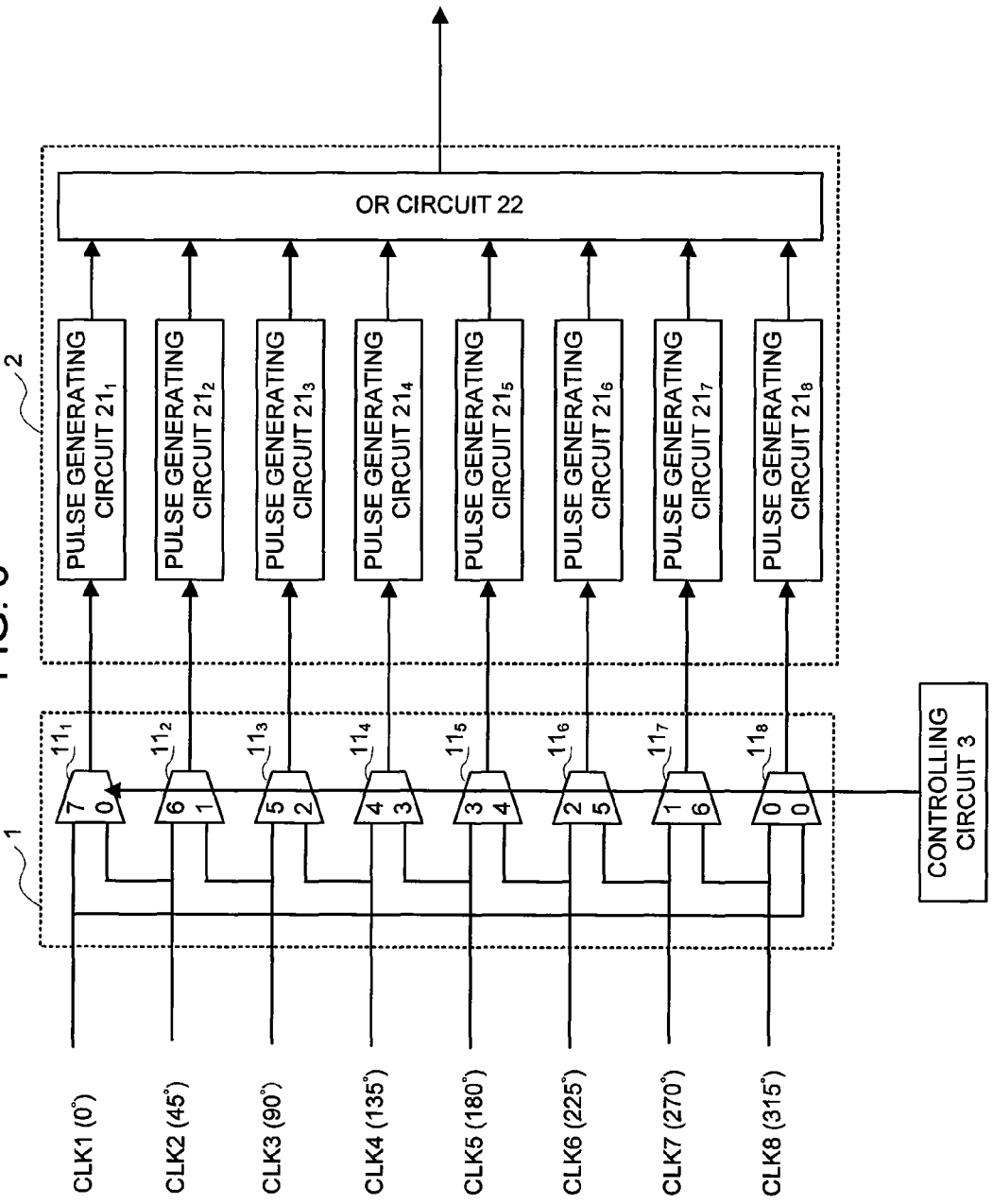
FIG. 6 is a view illustrating a configuration of the clock generating circuit in an example 1.

FIG. 6 is a view illustrating a configuration of the clock generating circuit in the example 1. Additionally, in the following example 1, for specific explanation, the multi-phase clock that is input into the clock generating circuit is assumed to be an eight-phase clock.

The clock generating circuit includes a clock converting circuit 1 for, with the eight-phase clock of a frequency f assumed to be an input, converting this into, for example, the seven-phase clock of a frequency f, a single-phase clock generating circuit 2 for generating the single-phase clock of a frequency (f×n) in synchronism with the rising edge of the multi-phase clock of a frequency f that is output from the clock converting circuit 1, and a controlling circuit 3 for giving the clock converting circuit 1 an instruction for the phase number of the multi-phase clock into which the eight-phase clock is converted in order to obtain the single-phase clock of a desired frequency.

The clock converting circuit 1 is for, with the eight-phase clock of a frequency f assumed to be an input, converting this eight-phase clock into the n-phase clock that is decided responding to the desired frequency of the single-phase clock. This clock converting circuit 1 includes eight phase interpolators $11_1$ to $11_8$, two clocks each having a different phase are input into each of the phase interpolators $11_1$ to $11_8$, and one clock having a predetermined phase is output by these two clocks. For example, in FIG. 6, a clock having a phase 0° and a clock having a phase 45° are input into the phase interpolator $11_1$, a clock having a phase 45° and a clock having a phase 90° are input into the phase interpolator $11_2$, a clock having a phase 90° and a clock having a phase 135° are input into the phase interpolator $11_3$, a clock having a phase 135° and a clock having a phase 180° are input into the phase interpolator $11_4$, a clock having a phase 180° and a clock having a phase 225° are input into the phase interpolator $11_5$, a clock having a phase 225° and a clock having a phase 270° are input into the phase interpolator $11_6$, a clock having a phase 270° and a clock having a phase 315° are input into the phase interpolator $11_7$, and a clock having a phase 315° and a clock having a phase 0° are input into the phase interpolator $11_8$.

Figure 7:
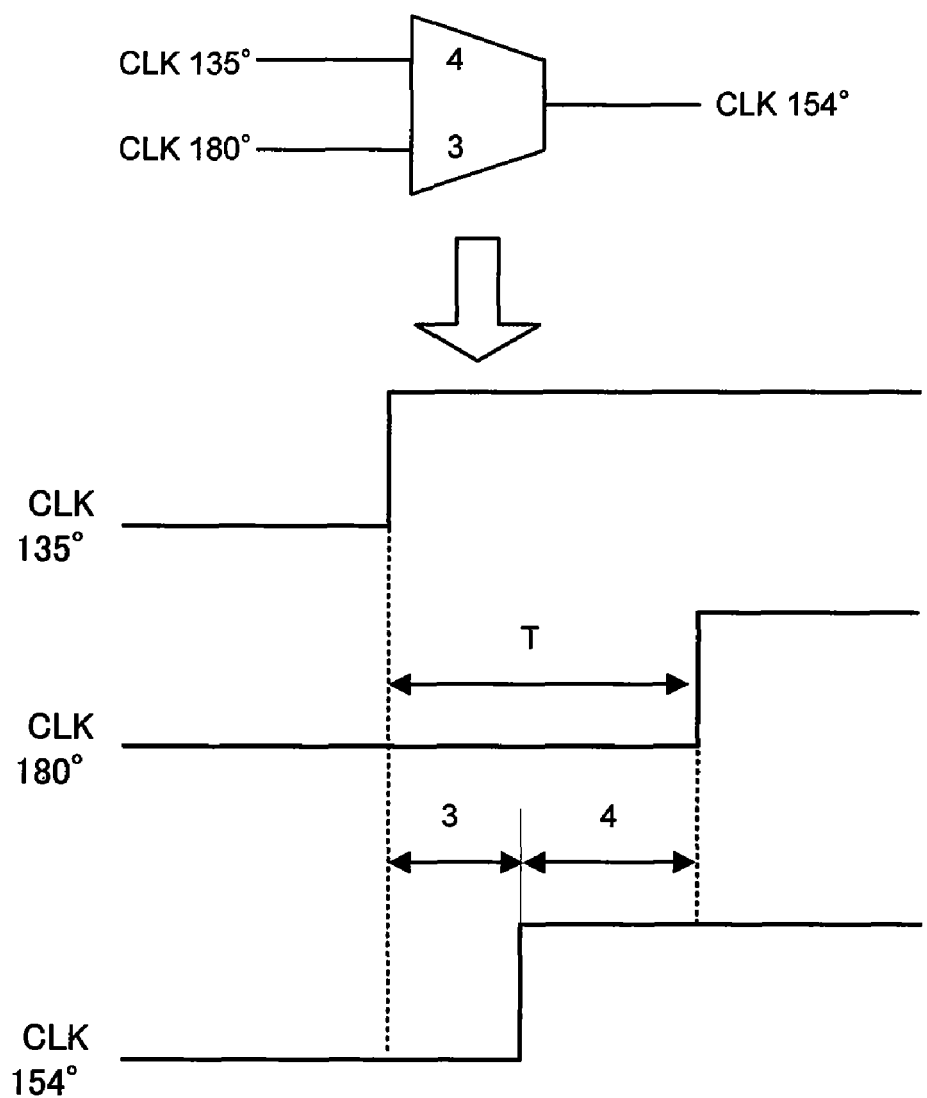
FIG. 7 is a view for explaining phase interpolators $11_1$ to $11_8$.

Each of the phase interpolators $11_1$ to $11_8$, which is given a setting value a and a setting value b (a+b=n) by the controlling circuit 3, as shown in FIG. 4, outputs a clock CLK (X) of a delay time that is specified by a time obtained on dividing a time difference T equivalent to a phase difference of a first input signal CLK (k) and a second input signal CLK (k+1) by (b:a). Specifically, as shown in FIG. 7, in a case where a=4, b=3, the phase of the first input signal CLK (k) is 135°, and the phase of the second input signal CLK (k+1) is 180°, the clock of a delay time that is specified by a time obtained on dividing a time difference T equivalent to a phase difference 45° of these signals by (3:4), i.e. the clock having a phase 154° is output.

Figure 8:
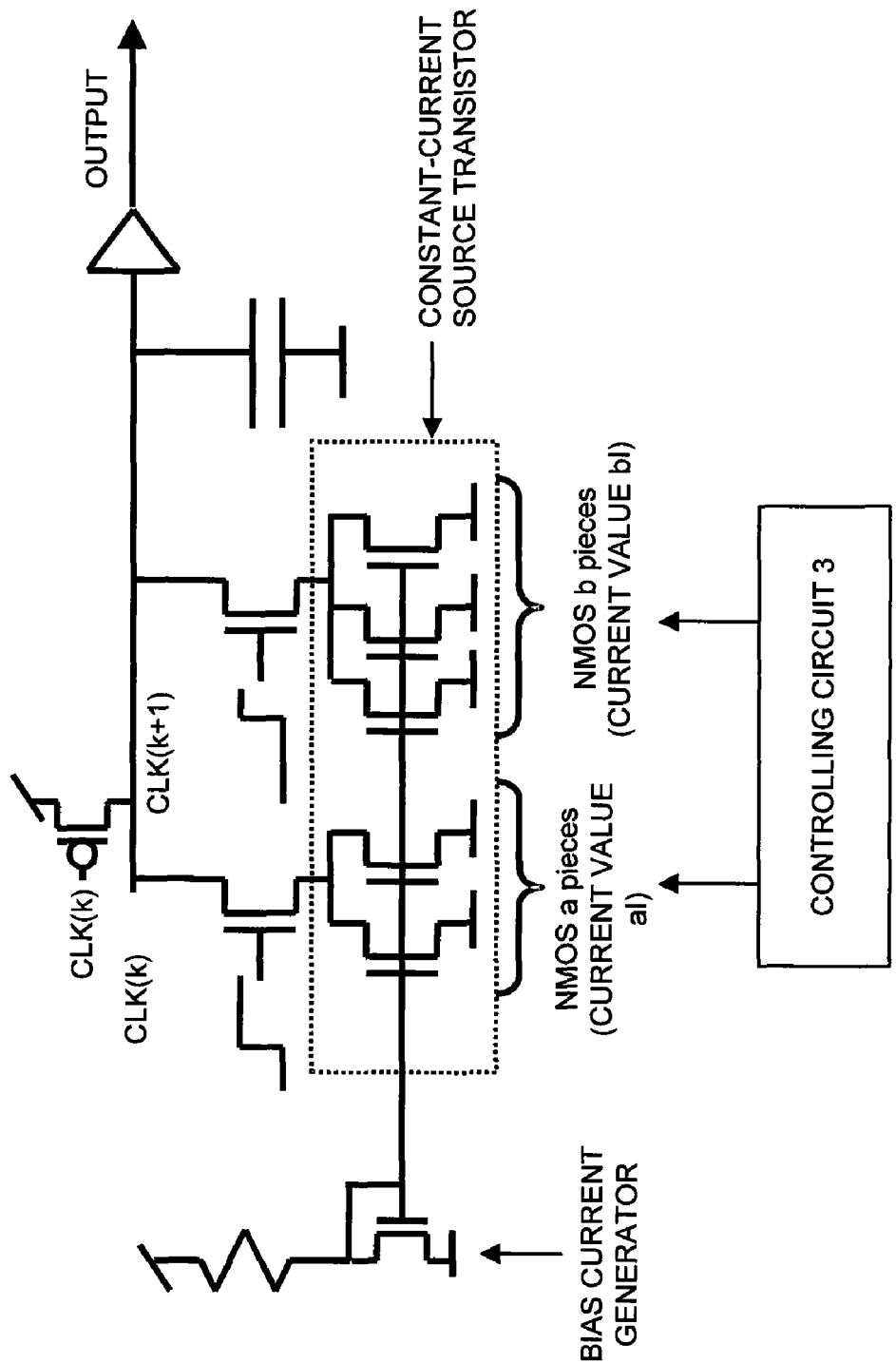
FIG. 8 is a view illustrating a specific circuit configuration of the phase interpolator.

A specific circuit configuration of such phase interpolators $11_1$ to $11_8$ is shown in FIG. 8.

Each of the phase interpolators $11_1$ to $11_8$, as shown in FIG. 8, combines a dynamic circuit and a constant-current source circuit, and assumes that a ratio of the number of NMOS transistors that operates by the first input signal (CLK (k)) and that of NMOS transistors that operates by the second input signal (CLK (k+1)) is (a:b), thereby making it possible to output a clock CLK (X) of a delay time that is specified by a time obtained on dividing a time difference T equivalent to a phase difference of two input signals by (b:a). Additionally, it is the controlling circuit 3 that controls the current value of a transistor.

Next, how to set the foregoing value a and value b will be explained.

Figure 9:
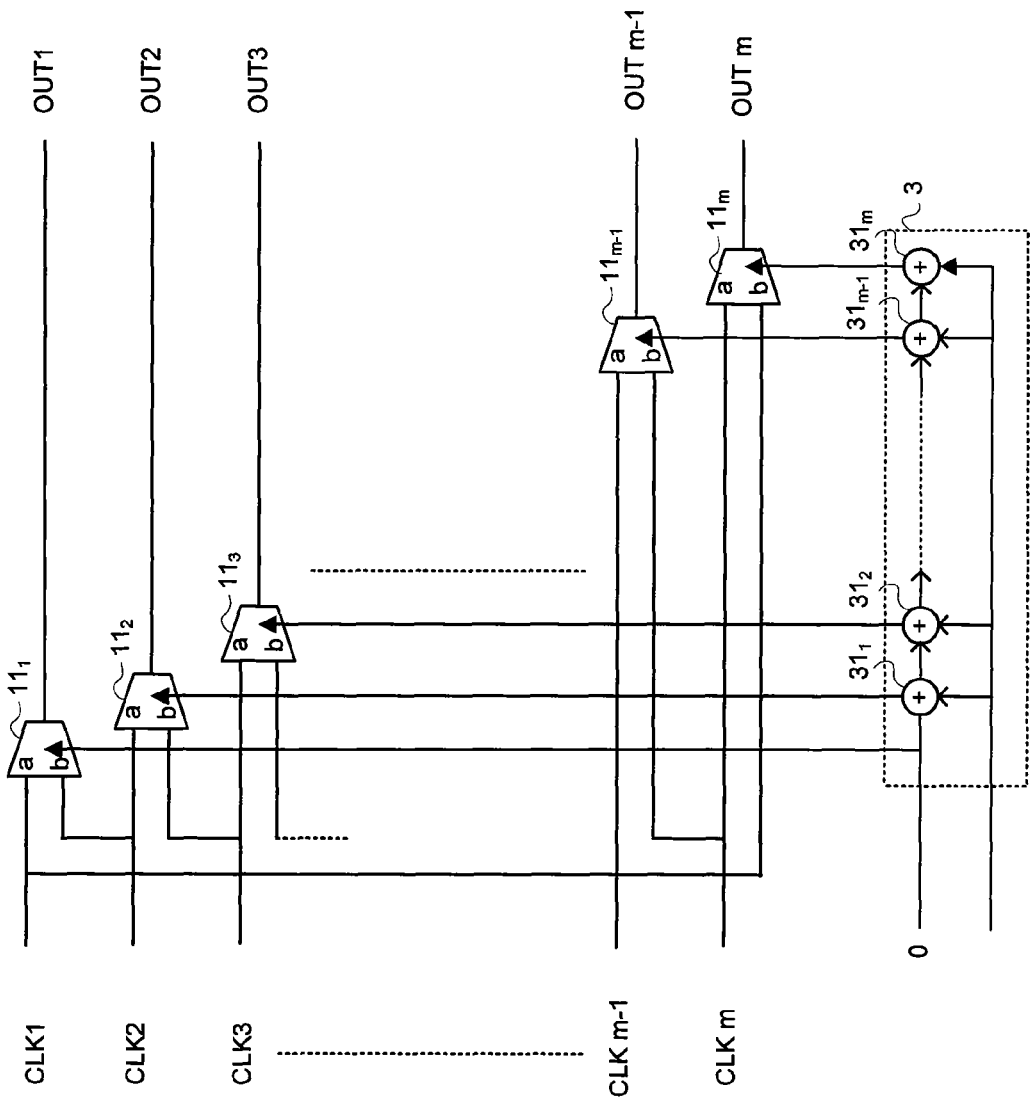
FIG. 9 is a view illustrating a circuit configuration of a controlling circuit 3.

FIG. 9 is a view for explaining how to set the value a and value b by the controlling circuit 3.

At first, in a case of converting the m-phase clock into the n-phase clock, n is set as a reference value X of each of the phase interpolators $11_1$ to $11_m$.

Next, the value b is set by the controlling circuit 3, which is configured of m adders $31_1$ to $31_m$ connected in serial as shown in FIG. 9. These adders $31_1$ to $31_m$, which can add two values ranging from 0 to (m−1), outputs its sum (SU) in a case where it is between 0 to (m−1), and output SU-M in a case where it is m or more to corresponding phase interpolators, respectively. Additionally, the value b of the phase interpolator $11_1$ is 0 normally, so the phase interpolator $11_1$ may not be connected with the adders $31_1$ to $31_m$.

In a case of converting the m-phase clock into the n-phase clock in such a controlling circuit 3, the value, being (m−n), is input into it.

The phase interpolators $11_1$ to $11_m$ set the output value from the three-bit adders $31_1$ to $31_m$ to the value b, and set the value, which is obtained from the equation a=X(n)−b, to the value a, respectively. Additionally, the phase interpolators $11_1$ to $11_m$ are configured to stop the operation in a case where the value b becomes a reference value X or more.

Figure 10:
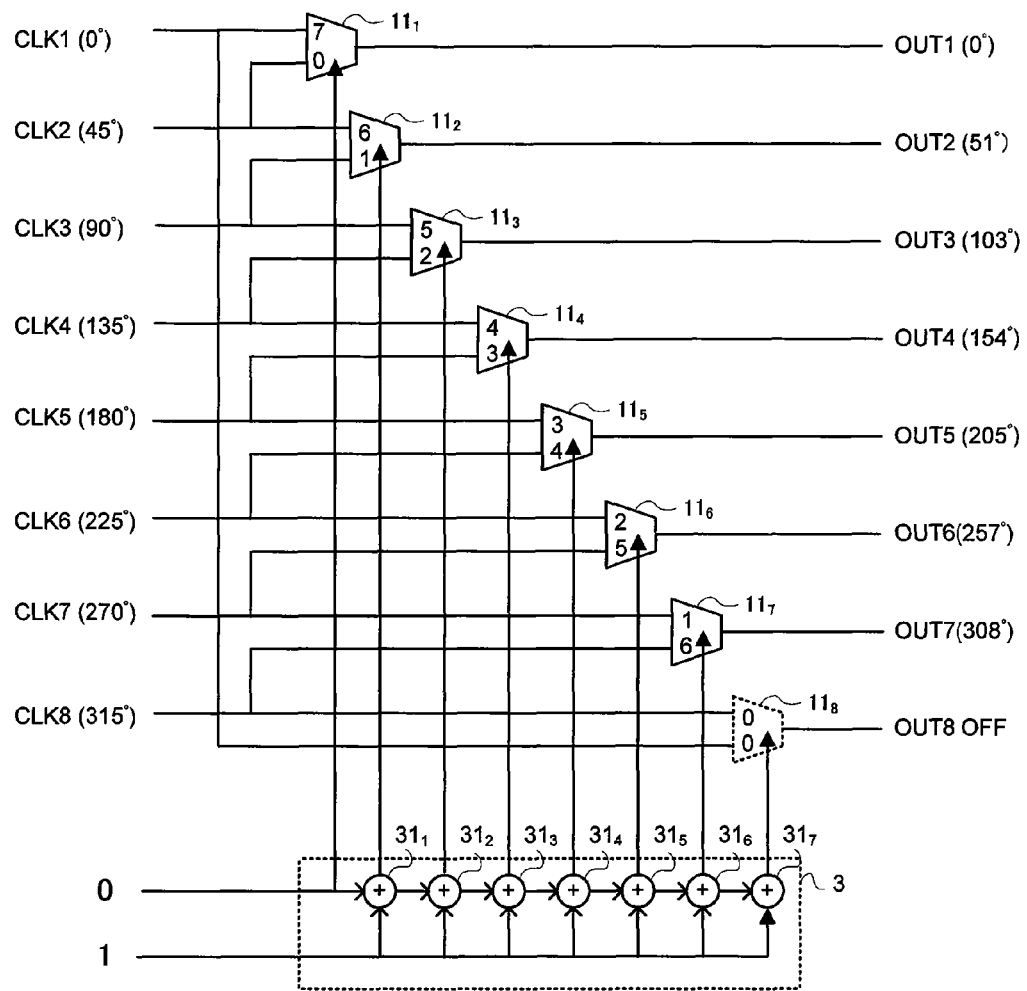
FIG. 10 is a view for explaining the setting of a value a and a value b by the controlling circuit 3.

Next, as a specific example, the case of converting the eight-phase clock into the seven-phase clock is explained by employing FIG. 10. As shown in FIG. 10, the controlling circuit 3 is configured of seven three-bit adders $31_1$ to $31_m$ connected in serial.

In such a configuration, upon explaining the case of converting the eight-phase clock into the seven-phase clock, the reference value X is seven, and the value that is input into the controlling circuit 3 is (8−7=1). And, the reference value X of each of the phase interpolators $11_1$ to $11_8$ is set to seven. Additionally, with the phase interpolators $11_1$, the values a=7 and b=0 are set at the time of setting.

When 1 is input into the controlling circuit 3, the three-bit adder $31_1$ outputs "1(001)" to the phase interpolators $11_2$, which sets "1" to the value b and "6(7−1)" to the value a, respectively. The three-bit adder $31_2$ outputs "2(010)" to the phase interpolators $11_3$, which sets "2" to the value b and "5(7−2)" to the value a, respectively. Continuously, the three-bit adder $31_3$ outputs "3(011)" to the phase interpolators $11_4$, which sets "3" to the value b and "4(7−3)" to the value a, respectively. Continuously, the three-bit adder $31_4$ outputs "4(100)" to the phase interpolators $11_5$, which sets "4" to the value b and "3(7−4)" to the value a, respectively. The three-bit adder 315 outputs "5(101)" to the phase interpolators $11_6$, which sets "5" to the value b and "2(7−5)" to the value a, respectively. Continuously, the three-bit adder $31_6$ outputs "6(111)" to the phase interpolators $11_7$, which sets "6" to the value b and "1(7−6)" to the value a, respectively. Finally, the three-bit adder $31_7$ outputs "7(111)" to the phase interpolators $11_8$; however the value b is "7", whereby the value b becomes equal to the reference value X, and the phase interpolators $11_8$ stops the operation.

In such a manner, the value a and the value b in the case of converting the eight-phase clock into the seven-phase clock are set.

Each of the phase interpolators $11_1$ and $11_8$ to which the value a and the value b have been set, as described above, outputs the clock of a delay time that is specified by a time obtained on dividing a time difference T of the two clocks by an interior division ratio of (b:a), thereby enabling the eight-phase clock to be converted into the seven-phase clock. In this example, the clock having a phase 0° is output from the phase interpolator $11_1$, the clock having a phase 51° is output from the phase interpolator $11_2$, the clock having a phase 103° is output from the phase interpolator $11_3$, the clock having a phase 154° is output from the phase interpolator $11_4$, the clock having a phase 205° is output from the phase interpolator $11_5$, the clock having a phase 257° is output from the phase interpolator $11_6$, the clock having a phase 308° is output from the phase interpolator $11_7$, and no clock is output from the phase interpolator $11_8$.

Next, the case of converting the eight-phase clock into the six-phase clock will be explained by employing FIG. 11.

In a case of converting the eight-phase clock into the six-phase clock, the reference value X is six, the value that is input into the controlling circuit 3 is (8−6=2). And, when 2 is input into the controlling circuit 3, the three-bit adder $31_1$ outputs "2(010)" to the phase interpolators $11_2$, which sets "2" to the value b and "4(6−2)" to the value a, respectively. Continuously, the three-bit adder $31_2$ outputs "4(100)" to the phase interpolators $11_3$, which sets "4" to the value b and "2(6−4)" to the value a, respectively.

Next, the three-bit adder $31_3$ outputs "6(110)" to the phase interpolators $11_4$; however the value b is "6", whereby the value b becomes equal to the reference value X, and the phase interpolators $11_4$ stops the operation.

In addition hereto, the three-bit adder $31_4$ outputs "0(000)" (three low-order bits) to the phase interpolator $11_5$, which sets "0" to the value b and "6(6−0)" to the value a, respectively. Continuously, the three-bit adder $31_5$ outputs "2(010)" to the phase interpolator $11_6$, which sets "2" to the value b and "4(6−2)" to the value a, respectively. Continuously, the three-bit adder $31_6$ outputs "4(100)" to the phase interpolator $11_7$, which sets "4" to the value b and "2(6−4)" to the value a, respectively.

Finally, the three-bit adder $31_6$ outputs "6(110)" to the phase interpolators $11_8$; however the value b is "6", whereby the value b becomes equal to the reference value X, and the phase interpolators $11_8$ stops the operation.

In such a manner, the value a and the value b in the case of converting the eight-phase clock into the six-phase clock are set.

Each of the phase interpolators $11_1$ to $11_8$ to which the value a and the value b have been set, as described above, outputs a clock of a delay time that is specified by a time obtained on dividing a time difference T of the two clocks by an interior division ratio of (b:a), thereby enabling the eight-phase clock to be converted into the six-phase clock. In this example, the clock having a phase 0° is output from the phase interpolator $11_1$, the clock having a phase 60° is output from the phase interpolator $11_2$, the clock having a phase 120° is output from the phase interpolator $11_3$, no clock is output from the phase interpolator $11_4$, the clock having a phase 180° is output from the phase interpolator $11_5$, the clock having a phase 240° is output from the phase interpolator $11_6$, the clocks having a phase 300° is output from the phase interpolator $11_7$, and no clock is output from the phase interpolator $11_8$.

Next, the single-phase clock generating circuit 2 will be explained.

The single-phase clock generating circuit 2 is configured of eight pulse generators $21_1$ to $21_8$, and an OR circuit 22. Each pulse generator 21, which is connected to each of the eight phase interpolators $11_1$ to $11_8$ at one versus one, is for generating pulses in synchronism with the clock that is output from the phase interpolator 11. Upon receipt of the pulses from each pulse generator 21, the OR circuit 22 computes a logical sum of these pulses, thereby to generate the single-phase clock.

In such a configuration, a specific operation will be explained below by employing FIG. 12. Additionally, in the following explanation, it is assumed for explanation that the multi-phase clock that is input into the clock converting circuit 1 is an eight-phase clock of which the frequency f is 250 MHz, and the desired frequency of the single-phase clock is 1.75 GHz.

At first, the desired frequency fa of the single-phase clock is 1.75 GHz, and fa=f×n, whereby n=7. Thus, the controlling circuit 3 controls the eight-phase clock, which is input into the clock converting circuit 1, so that it is converted into the seven-phase clock of a frequency 250 MHz.

At this time, with the value of (a,b) of each of the phase interpolators $11_1$ to $11_8$ that is set by the controlling circuit 3, it is (7,0) with the phase interpolators $11_1$, (6,1) with the phase interpolators $11_2$, it is (5,2) with the phase interpolators $11_3$, (4,3) with the phase interpolators $11_4$, (3,4) with the phase interpolators $11_5$, (2,5) with the phase interpolators $11_6$, (1,6) with the phase interpolators $11_7$, and (0,0) with the phase interpolators $11_8$.

Thereby, the clock having a phase 0° is output from the phase interpolator $11_1$, the clock having a phase 51° is output from the phase interpolator $11_2$, the clock having a phase 103° is output from the phase interpolator $11_3$, the clock having a phase 154° is output from the phase interpolator $11_4$, the clock having a phase 205° is output from the phase interpolator $11_5$, the clock having a phase 257° is output from the phase interpolator $11_6$, the clock having a phase 308° is output from the phase interpolator $11_7$, and no clock is output from the phase interpolator $11_8$.

Figure 12:
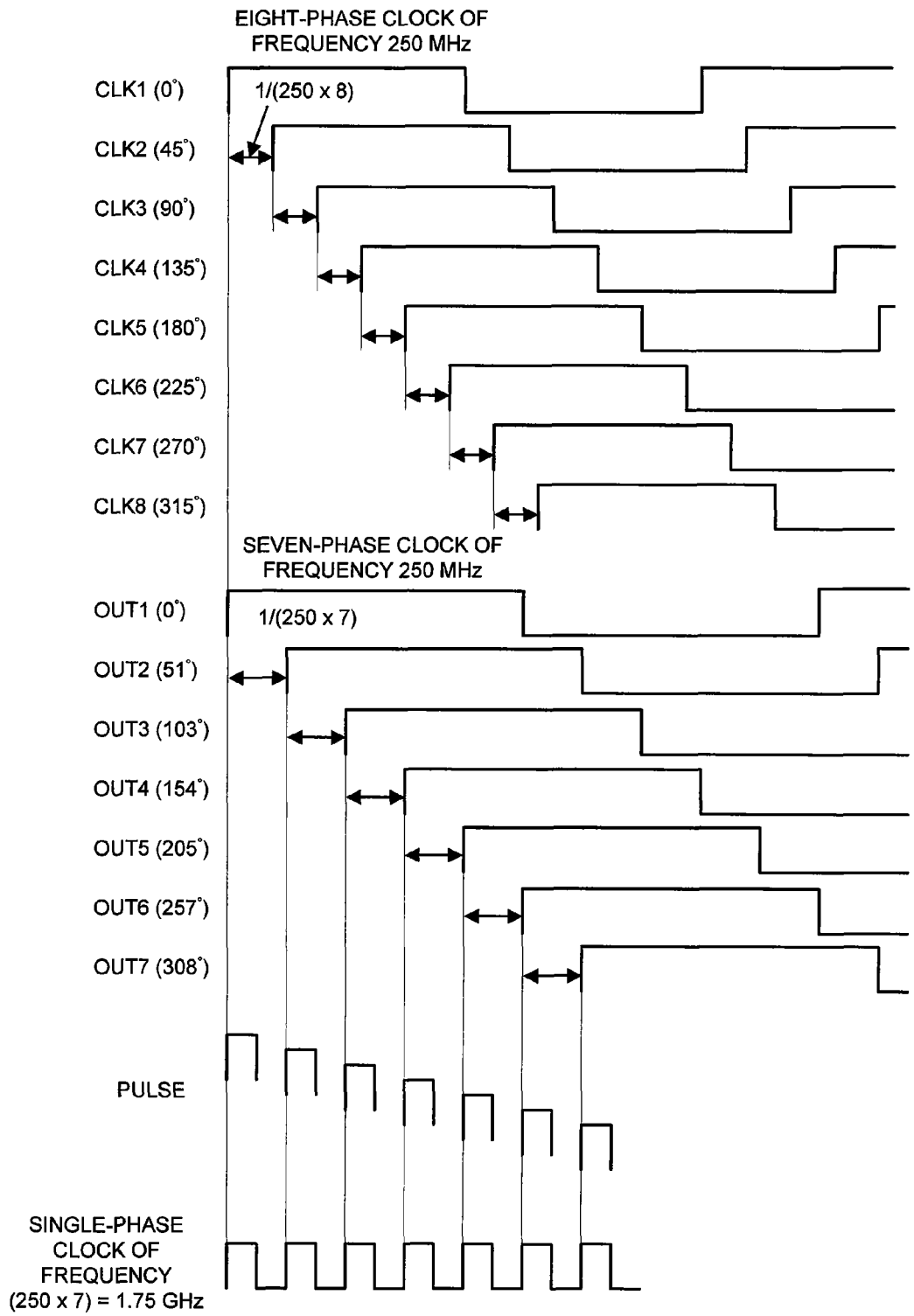
FIG. 12 is a view for explaining an operation of generating a single-phase clock of 1.75 GHz.

It is in FIG. 12 that this situation is shown. As shown in FIG. 12, with the seven-phase clock converted from the eight-phase clock, the time equivalent to a phase difference of each clock is 1/(250×7).

Continuously, these seven-phase clocks are input into the pulse generators $21_1$ to $21_8$, in which the pulses are produced in synchronism with the rising edge of each clock. For example, the pulse is produced by the clock having a phase 0° in the pulse generator $21_1$, the pulse is produced by the clock having a phase 51° in the pulse generator $21_2$, the pulse is produced by the clock having a phase 103° in the pulse generator $21_3$, the pulse is produced by the clock having a phase 154° in the pulse generator $21_4$, the pulse is produced by the clock having a phase 205° in the pulse generator $21_5$, the pulse is produced by the clock having a phase 257° in the pulse generator $21_6$, the pulse is produced by the clock having a phase 308° in the pulse generator $21_7$, and no pulse is produced in the pulse generator $21_8$. The cycle of each pulse is 1/(250×7).

The pulses produced by the pulse generators $21_1$ to $21_8$ are input into the OR circuit 22, in which a logical sum of these pulses is computed, thereby to produce the single-phase clock of 250×7=1750=1.75 GHz.

Continuously, the case of producing the single-phase clock of 1.5 GHz will be explained.

The desired frequency fa is 1.5 GHz, and f is 250 MHz, whereby the equation fa=f×n yields n=6. Thus, the controlling circuit 3 controls the eight-phase clock, which is input into the clock converting circuit 1, so that it is converted into the six-phase clock of a frequency 250 MHz.

At this time, with the value of (a,b) of each of the phase interpolators $11_1$ to $11_8$, it is (6,0) with the phase interpolator $11_1$, (4,2) with the phase interpolator $11_2$, (2,4) with the phase interpolator $11_3$, (0,0) with the phase interpolators $11_4$, (6,0) with the phase interpolators $11_5$, (4,2) with the phase interpolator $11_6$, (2,4) with the phase interpolator $11_7$, and (0,0) with the phase interpolator $11_8$, respectively. Thereby, the clock having a phase 0° is output from the phase interpolator $11_1$, the clock having a phase 60° is output from the phase interpolator $11_2$, the clock having a phase 120° is output from the phase interpolator $11_3$, no clock is output from the phase interpolator $11_4$, the clock having a phase 180° is output from the phase interpolator $11_5$, the clock having a phase 240° is output from the phase interpolator $11_6$, the clock having a phase 300° is output from the phase interpolator $11_7$, and no clock is output from the phase interpolator $11_8$.

Figure 13:
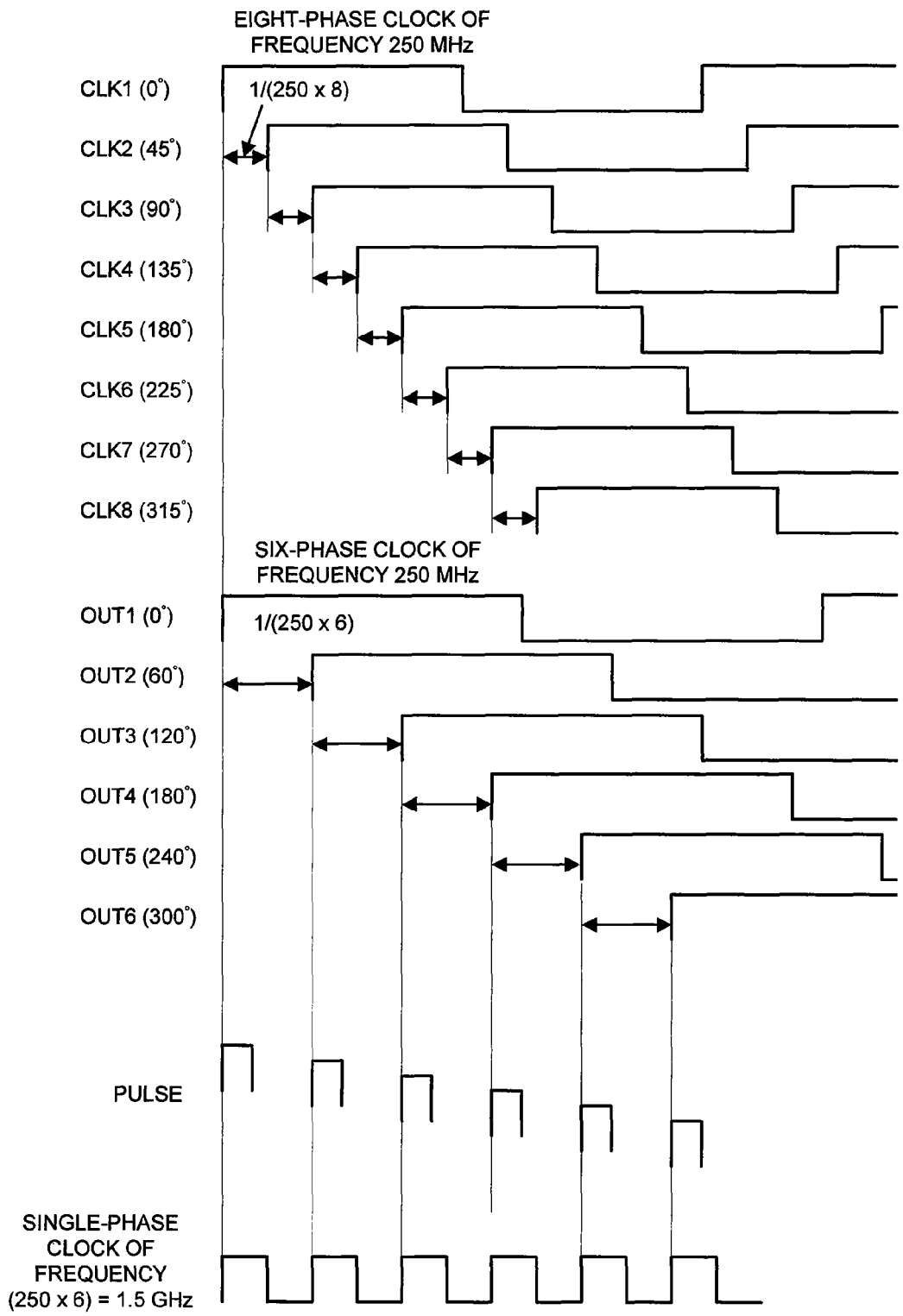
FIG. 13 is a view for explaining an operation of generating a single-phase clock of 1.5 GHz.

It is in FIG. 13 that this situation is shown. As shown in FIG. 13, with the six-phase clock converted from the eight-phase clock, the time equivalent to a phase difference of each clock is 1/(250×6).

Continuously, these six-phase clocks are input into the pulse generators $21_1$ to $21_8$, in which the pulses are produced in synchronism with the rising edge of each clock. For example, the pulse is produced by the clock having a phase 0° in the pulse generator $21_1$, the pulse is produced by the clock having a phase 60° in the pulse generator $21_2$, the pulse is produced by the clock having a phase 120° in the pulse generator $21_3$, no pulse is produced in the pulse generator $21_4$, the pulse is produced by the clock having a phase 180° in the pulse generator $21_5$, the pulse is produced by the clock having a phase 240° in the pulse generator $21_6$, the pulse is produced by the clock having a phase 300° in the pulse generator $21_7$, and no pulse is produced in the pulse generator $21_8$. The cycle of each pulse is 1/(250×6).

The pulses produced by the pulse generators $21_1$ to $21_8$ are input into the OR circuit 22, in which a logical sum of these pulses is computed, thereby to produce the single-phase clock of 250×6=1500=1.5 GHz.

Figure 23:
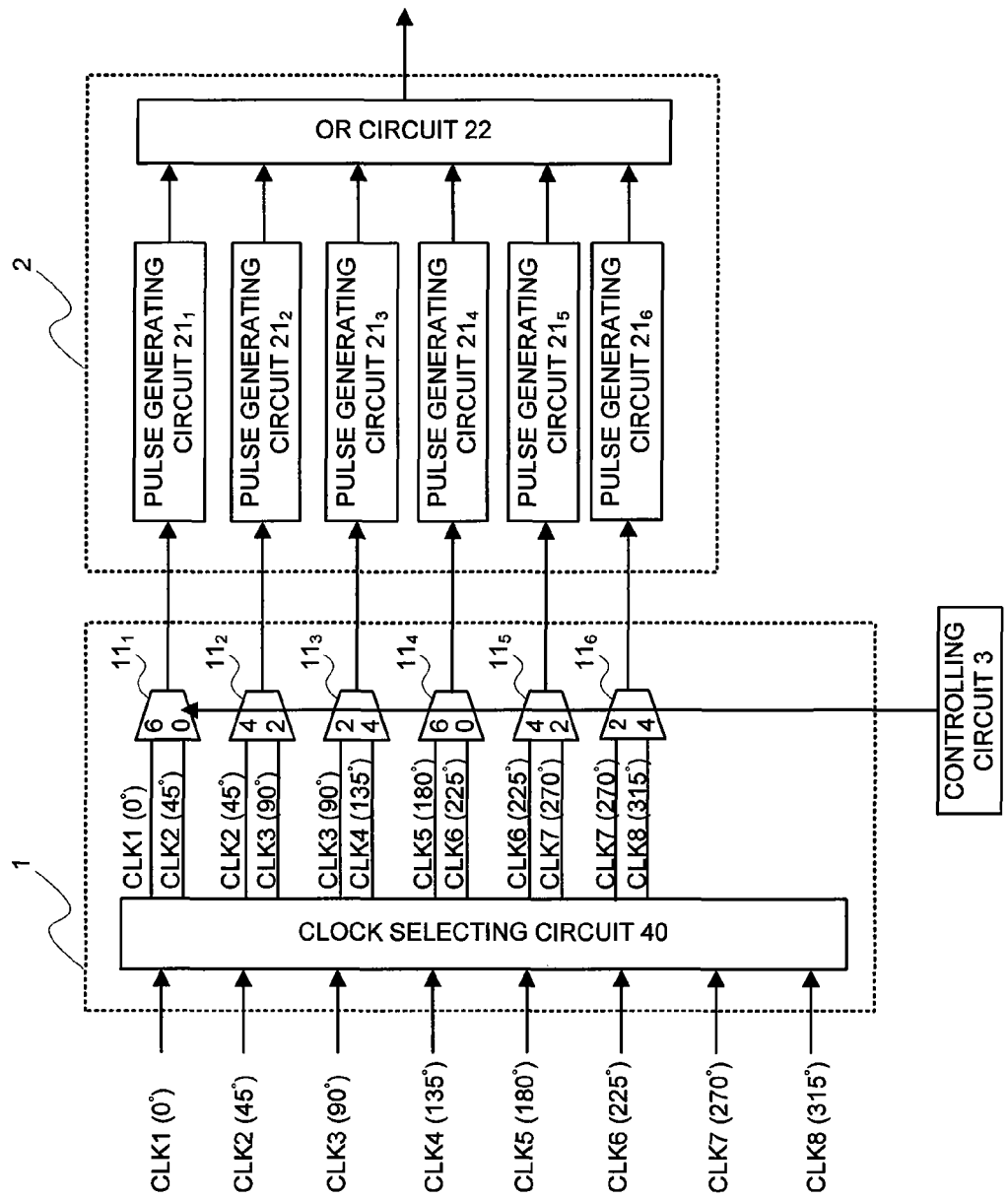
FIG. 23 is a view illustrating a configuration of another clock generating circuit in the example 1.

Additionally, in this example, the example in which the number of the phase interpolator and the pulse generator was assumed to be m, respectively, according to the clock number of the m-phase clock that was input into the clock converting circuit 1 was explained; however in a case where the phase number of the multi-phase clock that is converted in the clock converting circuit 1 is n or less, the present invention can be realized as long as there exist at least n phase interpolators and n pulse generators. For example, as shown in FIG. 23, in a case of converting the eight-phase clock into the multi-phase clock of which the phase number is six or less, six phase interpolators $11_1$ to $11_6$ and six pulse generators $21_1$ to $21_6$ are provided. And, a configuration is made so that a clock selecting circuit 40 is provided for selecting the clock having six phases, which is required, from the eight-phase clock under control of the controlling circuit 3, and this clock selecting circuit 40 outputs the clocks having each phase to the corresponding phase interpolators $11_1$ to $11_6$. The case of converting the eight-phase clock into the six-phase clock is shown in FIG. 23, in which the clock having a phase 0° and the clock having a phase 45° are input into the phase interpolator $11_1$, the clock having a phase 45° and the clock having a phase 90° are input into the phase interpolator $11_2$, the clock having a phase 90° and the clock having a phase 135° are input into the phase interpolator $11_3$, the clock having a phase 180° and the clock having a phase 225° are input into the phase interpolator $11_4$, the clock having a phase 225° and the clock having a phase 270° are input into the phase interpolator $11_5$, and the clock having a phase 270° and the clock having a phase 315° are input into the phase interpolator $11_6$. An operation to be described later is similar to that of the foregoing example.

Example 2

An example 2 of the present invention will be explained.

In this example 2, an example in which the foregoing clock generating circuit of the present invention has a function of correcting a phase added will be explained. Additionally, the detailed explanation of a component similar to that of the foregoing embodiment and example 1 is omitted in the following explanation.

Figure 14:
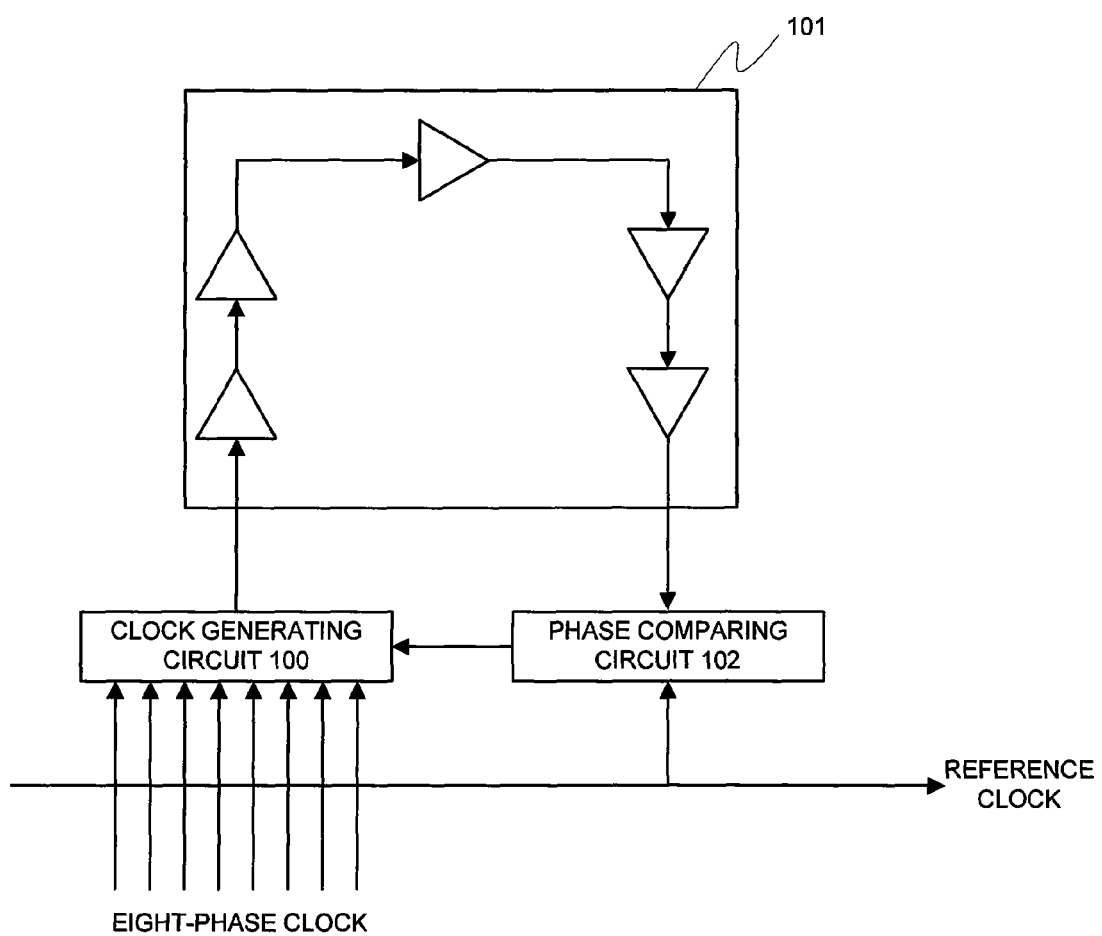
FIG. 14 is a view illustrating a configuration of an example 2.

FIG. 14 is a view illustrating a configuration of the example 2, and in FIG. 14, 100 is a clock generating circuit of the present invention, 101 is a circuit region, to which the clock generated in the clock generating circuit 100 is distributed, and which operates by this clock, and 102 is a phase comparator for comparing the phase of a clock (hereinafter, referred to as an end-distribution clock) distributed in the end of the circuit region 101 with that of a reference clock of the entirety of the circuit.

It was mentioned above that the clock generating circuit 100 was able to adjust the phase of each multi-phase clock by the phase interpolators $11_1$ to $11_8$. With the eight-phase clock, adjusting a time equivalent to a phase difference by the phase interpolators $11_1$ to $11_8$ enables the phase to be adjusted every 45/7≈6.4°. Additionally, in a case of having converted m-phase clock into n-phase clock, the phase can be adjusted every 360/(m×n)°. Employing this makes it possible to perform a phase correction for allowing the timing of the end-distribution clock to coincide with that of the reference clock.

Figure 15:
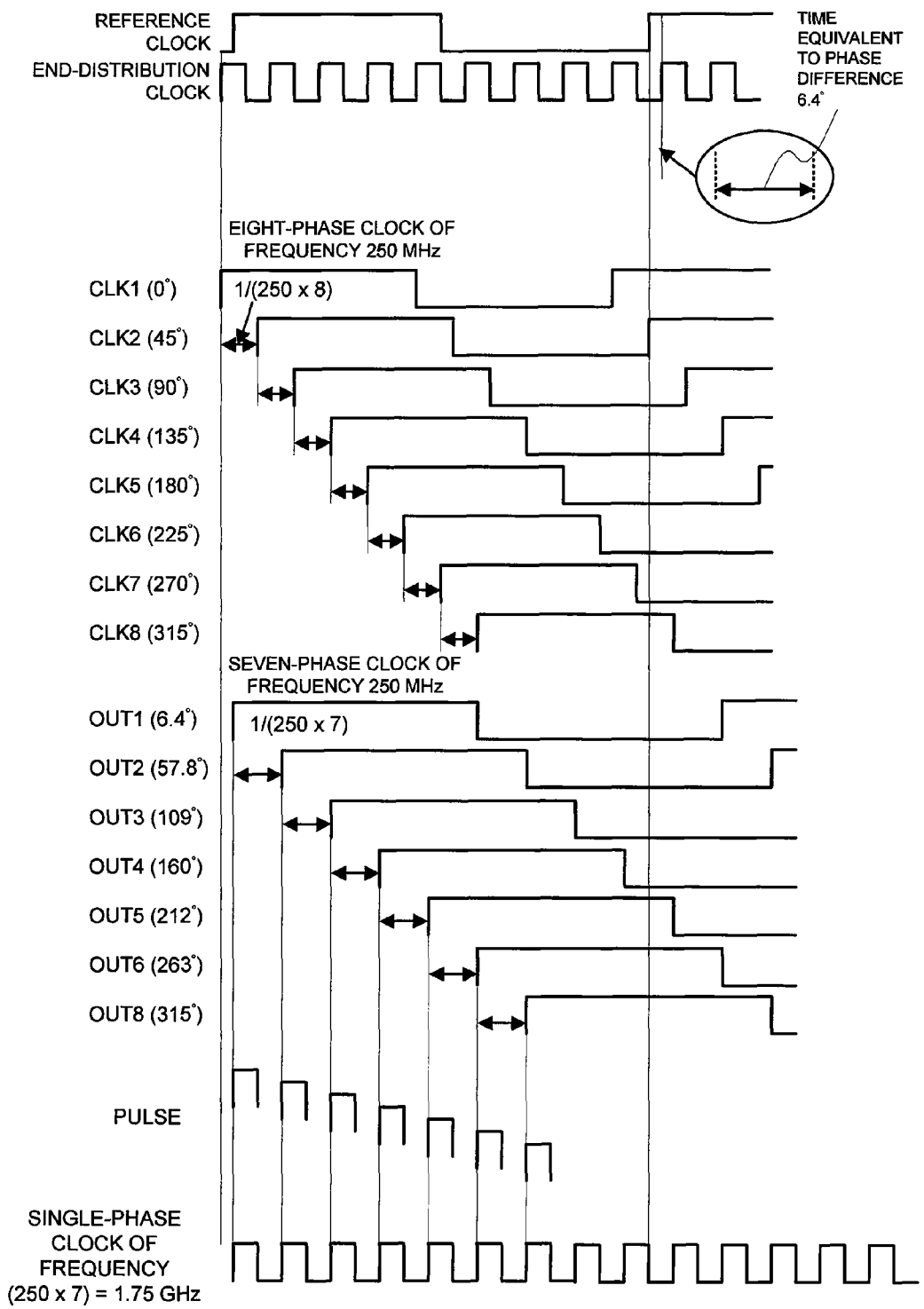
FIG. 15 is a view for explaining the example 2.

For example, as shown in FIG. 15, in a case where the end-distribution clock is a distribution clock of the single-phase clock generated by employing the seven-phase clock converted from the eight-phase clock, and the timing difference of this end-distribution clock and the reference clock is a time equivalent to a phase difference 6.4°, the seven-phase clock may be delayed only the time equivalent to a phase difference 6.4°, thereby to adjust the phase of the seven-phase clock.

Figure 16:
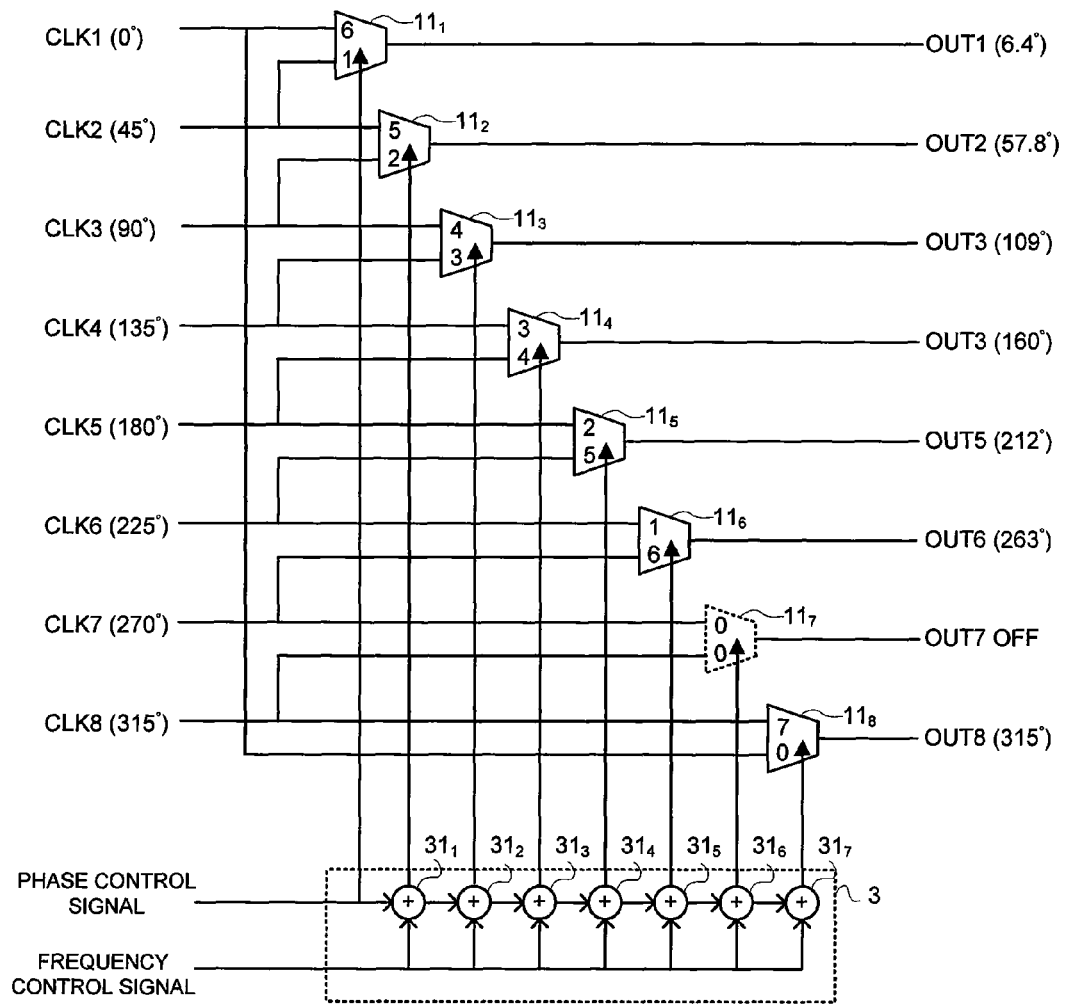
FIG. 16 is a view having a configuration illustrated of the controlling circuit 3 and the phase interpolators $11_1$ to $11_8$ that are capable of adjusting the phase in the example 2.

Thereupon, a configuration of the controlling circuit 3 and phase interpolators $11_1$ to $11_8$ that are capable of adjusting such a phase is shown in FIG. 16.

Figure 11:
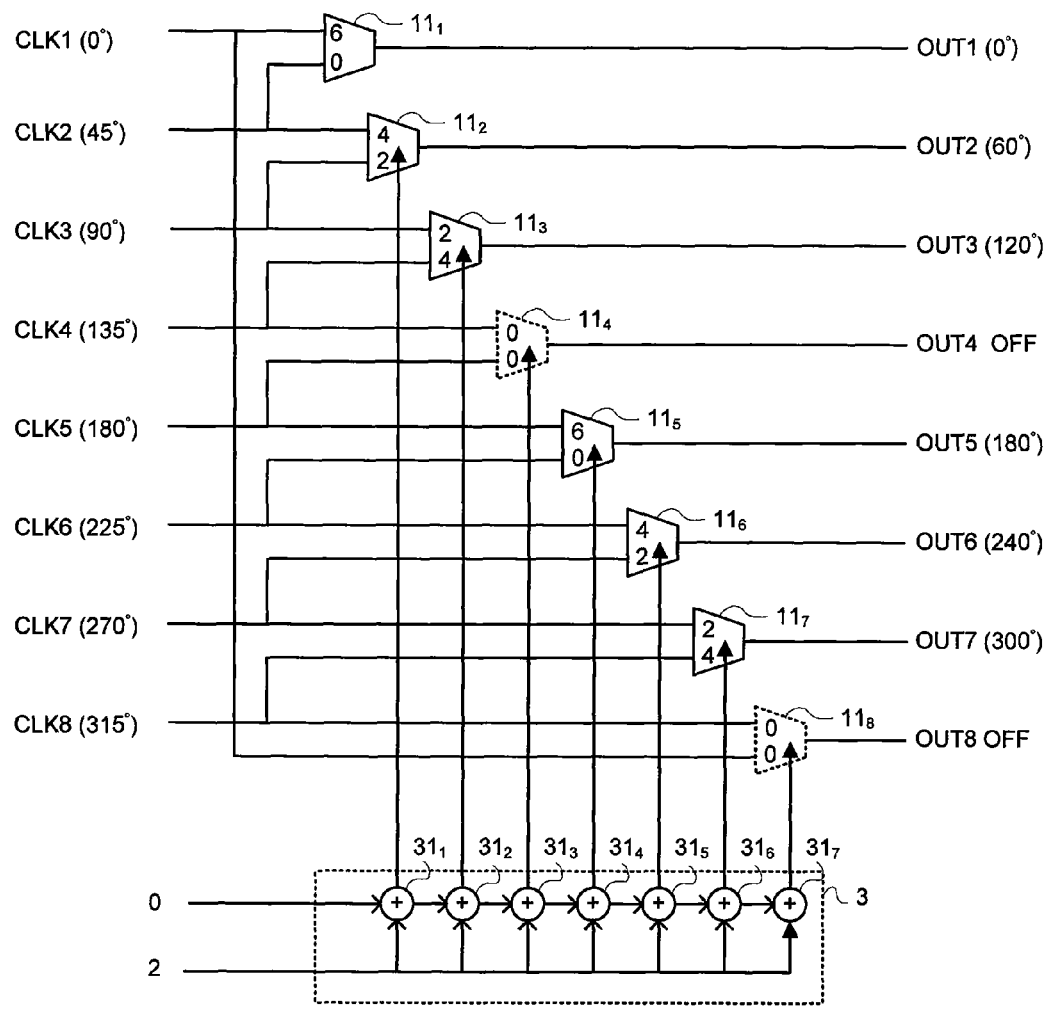
FIG. 11 is a view for explaining the setting of a value a and a value b by the controlling circuit 3.

The point in which the controlling circuit 3 and phase interpolators $11_1$ to $11_8$ shown in FIG. 16 differ from that of the foregoing FIG. 9, FIG. 10, and FIG. 11 is that a phase control signal for controlling a phase is input into the controlling circuit 3, and this control signal is input into the three-bit adder $31_1$ and the phase interpolator $11_1$.

Further, the phase comparing circuit 102 compares the phase of the end-distribution clock of the circuit region 101 with that of the reference clock, replaces this phase difference with a numerical figure, and output it. For example, with the eight-phase clock, the phase comparing circuit 102 causes seven phase differences stepped-up every 6.4° to correspond to the numerical figure ranging 0 to 6 in such a manner that 0°=0, 6.4°=1, 12.8°=2, and so on, and outputs it.

Additionally, a configuration of the phase interpolators $11_1$ to $11_8$ is identical to the forgoing one, so the detailed explanation of the configuration is omitted.

The controlling circuit 3, phase interpolators $11_1$ to $11_8$, and phase comparing circuit 102 configured in such a manner operate as follows.

In a case where the timing difference of the end-distribution clock and the reference clock is a time equivalent to a phase difference 6.4°, the phase comparing circuit 102 outputs "1" as the phase control signal. The reference value X of the phase interpolators $11_1$ to $11_8$ is seven, and the frequency control signal is "1".

When "1" is input as the phase control signal, and "1" as the frequency control signal, "1(001)" is input into the phase interpolators $11_1$, which sets "1" to the value b and "6(7−1)" to the value a, respectively.

Continuously, the three-bit adder $31_1$ outputs "2(010)" to the phase interpolators $11_2$, which sets "2" to the value b and "5(7−2)" to the value a, respectively. The three-bit adder $31_2$ outputs "3(011)" to the phase interpolators $11_3$, which sets "3" to the value b and "4(7−3)" to the value a, respectively.

Next, the three-bit adder $31_3$ outputs "4(100)" to the phase interpolators $11_4$, which sets "4" to the value b and "3(7−4)" to the value a, respectively. Continuously, the three-bit adder $31_4$ outputs "5(101)" to the phase interpolators $11_5$, which sets "5" to the value b and "2(7−5)" to the value a, respectively.

Further, the three-bit adder $31_5$ outputs "6(110)" to the phase interpolators $11_6$, which sets "6" to the value b and "1(7−6)" to the value a, respectively. Continuously, the three-bit adder $31_6$ outputs "7(111)" to the phase interpolators $11_7$; however the value b is "7", whereby the value b becomes equal to the reference value X, and the phase interpolators $11_7$ stops the operation.

Finally, the three-bit adder $31_7$ outputs "0(000)" (three lower-order bits) to the phase interpolators $11_8$, which sets "0" to the value b and "7(7−0)" to the value a, respectively.

Thereby, the clock having a phase 6.4° is output from the phase interpolator $11_1$, the clock having a phase 57.8° is output from the phase interpolator $11_2$, the clock having a phase 109° is output from the phase interpolator $11_3$, the clock having a phase 160° is output from the phase interpolator $11_4$, the clock having a phase 212° is output from the phase interpolator $11_5$, the clock having a phase 263° is output from the phase interpolator $11_6$, no clock is output from the phase interpolator $11_7$, and the clock having a phase 315° is output from the phase interpolator $11_8$.

Continuously, these seven-phase clocks are input into the pulse generators $21_1$ to $21_8$, in which the pulses are produced in synchronism with the rising edge of each clock. The pulses produced by the pulse generators $21_1$ to $21_8$ are input into the OR circuit 22, and a logical sum of these pulses is computed, thereby, allowing the phase to be shifted by 6.4°, the single-phase clock of which the timing coincides with that of the reference clock to be generated, and the timing of the end-distribution clock and that of the reference clock to coincide with each other.

Example 3

An example 3 will be explained.

In the foregoing example 1 and example 2, the phase interpolates and the pulse generators were provided so that the former and the latter had a one-versus-one relation for the m-phase clock. For example, with the eight-phase clock, eight phase interpolates $11_1$ to $11_8$ and eight pulse generators $21_1$ to $21_8$ were provided for a configuration. In a case where the phase number of the multi-phase clock is even (m is an even number), however, it is also possible to halve the number of the phase interpolates and the pulse generators, respectively. Thereupon, in the example 3, the clock generating circuit configured by halving the number of the phase interpolates and the pulse generators will be explained.

Figure 17:
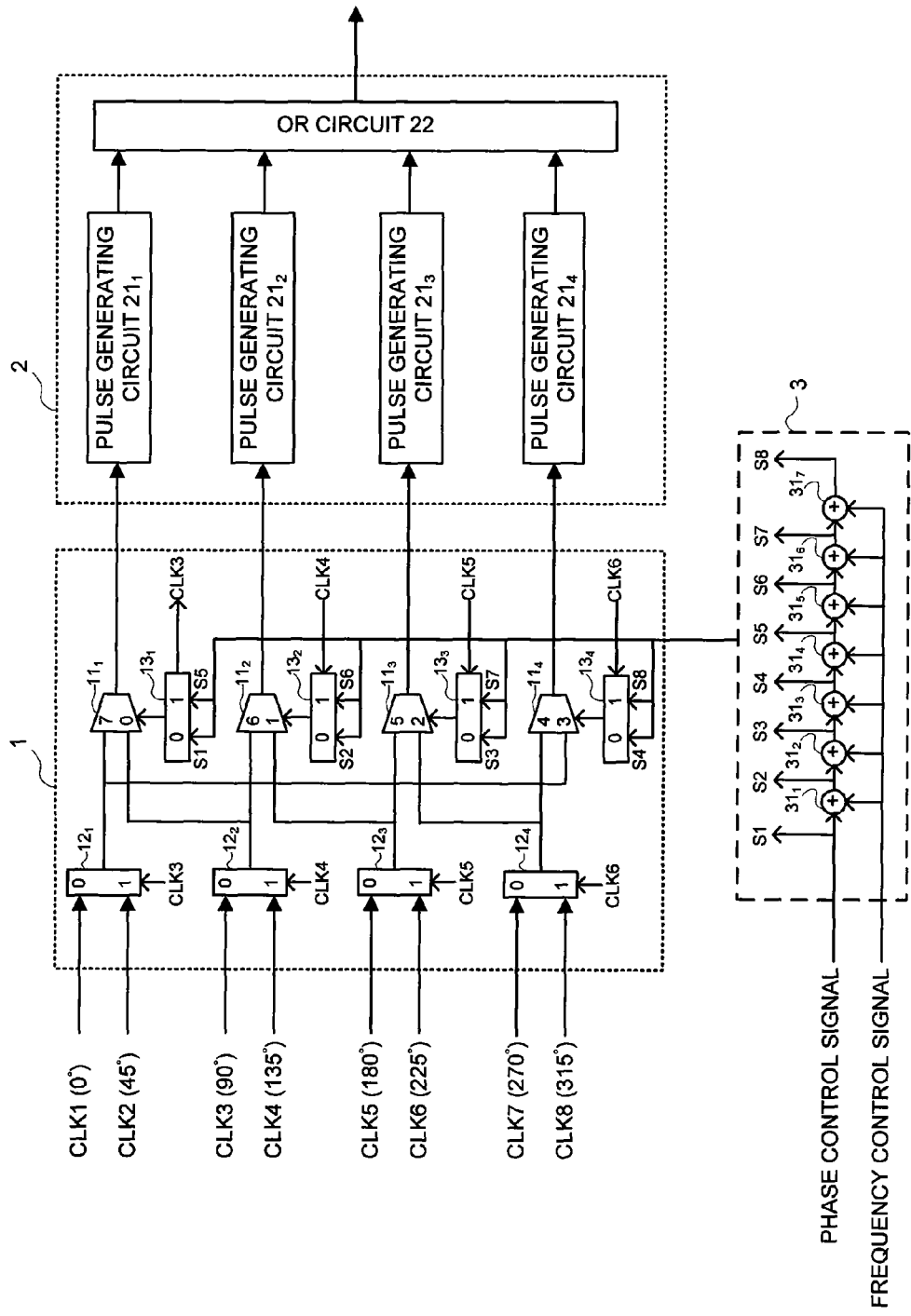
FIG. 17 is a view having a configuration of an example 3 illustrated.

FIG. 17 is a view having a configuration of the clock generating circuit of the example 3 illustrated. Additionally, an identical numeral is affixed to a component similar to that of the example 1 and the example 2.

The point in which the example 3 differs from the example 1 and the example 2 is that the number of the phase interpolates and the pulse generators is halved, respectively, and clock selecting circuits $12_1$ to $12_4$ for selecting the multi-phase clock, and interior division ratio selecting circuits $13_1$ to $13_4$ for selecting the value (a, b) for deciding an interior division ratio of the phase interpolators $11_1$ to $11_4$ are provided.

A configuration is made so that two clocks each having a different phase are input into each of the clock selecting circuits $12_1$ to $12_4$, and one clock signal is output by the selection control signal.

In FIG. 17, the clock CLK1 having a phase 0° and the clock CLK5 having a phase 180° are input, and the clock CLK3 is input as the selection control signal into the clock selecting circuit $12_1$, respectively. And a configuration is made so that the clock CLK1 is selected when the clock CLK3 is at a low level, and the clock CLK5 is selected when it is at a high level.

Further, the clock CLK2 having a phase 45° and the clock CLK6 having a phase 225° are input, and the clock CLK4 is input as the selection control signal into the clock selecting circuit $12_2$, respectively. And a configuration is made so that the clock CLK2 is selected when the clock CLK4 is at a low level, and the clock CLK6 is selected when it is at a high level.

Further, the clock CLK3 having a phase 90° and the clock CLK7 having a phase 270° are input, and the clock CLK5 is input as the selection control signal into the clock selecting circuit $12_3$, respectively. And a configuration is made so that the clock CLK3 is selected when the clock CLK5 is at a low level, and the clock CLK7 is selected when it is at a high level.

Further, the clock CLK4 having a phase 135° and the clock CLK8 having a phase 315° are input, and the clock CLK6 is input as the selection control signal into the clock selecting circuit $12_4$, respectively. And a configuration is made so that the clock CLK4 is selected when the clock CLK6 is at a low level, and the clock CLK8 is selected when it is at a high level.

A configuration is made so that two values b and b that are output from the controlling circuit 3 are input into the interior division ratio selecting circuits $13_1$ to $13_4$ and one value b is output to the phase interpolators $11_1$ to $11_4$ by the selection control signal.

FIG. 17 shows the case that the phase control signal that is input into the controlling circuit 3 is "0" and the frequency control signal is "1", and an output S1 and an output S5 of the three-bit adder $31_4$ are input, and the clock CLK3 is input as the selection control signal into the interior division ratio selecting circuit $13_1$, respectively. And, a configuration is made so that the output S1 is selected when the clock CLK3 is at a low level, and the output S5 is selected when it is at a high level to output them to the phase interpolator $11_1$.

Further, an output S2 of the three-bit adder $31_1$ and an output S6 of the three-bit adder $31_5$ are input, and the clock CLK4 is input as the selection control signal into the interior division ratio selecting circuit $13_2$, respectively. And, a configuration is made so that the output S2 is selected when the clock CLK4 is at a low level, and the output S6 is selected when it is at a high level to output them to the phase interpolator $11_2$.

Further, an output S3 of the three-bit adder $31_2$ and an output S7 of the three-bit adder $31_6$ are input, and the clock CLK5 is input as the selection control signal into the interior division ratio selecting circuit $13_3$, respectively. And, a configuration is made so that the output S3 is selected when the clock CLK5 is at a low level, and the output S7 is selected when it is at a high level to output them to the phase interpolator $11_3$.

Further, an output S4 of the three-bit adder $31_3$ and an output S8 of the three-bit adder $31_7$ are input, and the clock CLK6 is input as the selection control signal into the interior division ratio selecting circuit $13_4$, respectively. And, a configuration is made so that the output S4 is selected when the clock CLK6 is at a low level, and the output S8 is selected when it is at a high level to output them to the phase interpolator $11_4$.

Each of the phase interpolators $11_1$ to $11_4$ outputs the clock signal having the phase according to an interior division ratio that is decided by the value a and the value b similarly to the case of the example 1 and the example 2.

Further, each of the pulse generators $21_1$ to $21_4$, which is provided correspondingly to each of the phase interpolators $11_1$ to $11_4$ at one versus one, outputs the pulse similarly to the case of the example 1 and the example 2.

An operation in such a configuration will be explained.

Figure 18:
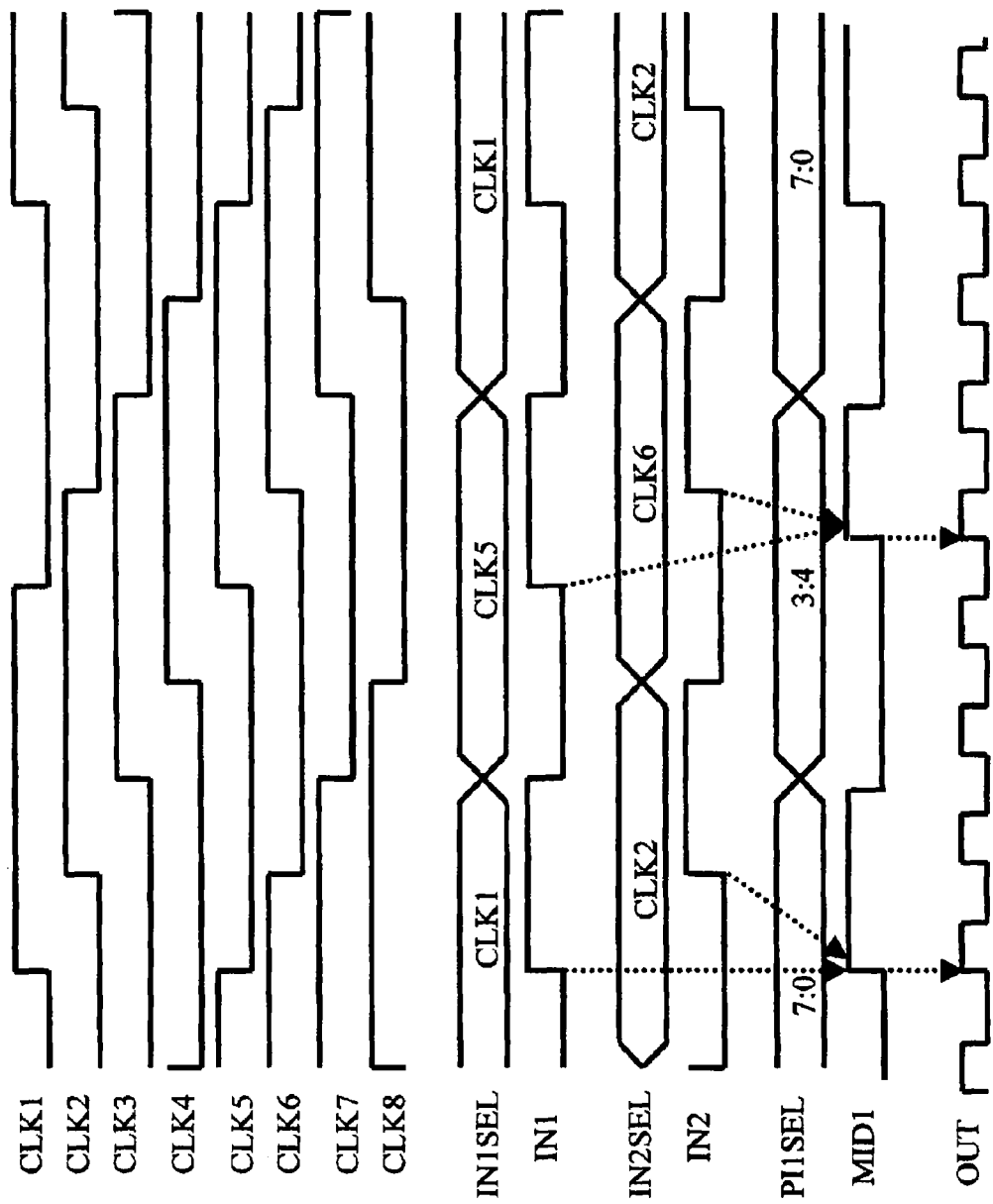
FIG. 18 is a view for explaining an operation of an example 3.

FIG. 18 is a timing diagram having the operation of the clock selecting circuit $12_1$ and the phase interpolator $11_1$ taken into consideration.

According to FIG. 18, at first, the clock CLK1 having a phase 0° and the clock CLK5 having a phase 180° are input, and the clock CLK3 is input as the selection control signal into the clock selecting circuit $12_1$, respectively. And, the clock CLK1 is selected when the clock CLK3 is at a low level. On the other hand, the clock CLK2 having a phase 45° and the clock CLK6 having a phase 225° are input, and the clock CLK4 is input as the selection control signal into the clock selecting circuit $12_2$, respectively. And, the clock CLK2 is selected when the clock CLK4 is at a low level.

Thus, at this time point, the clocks that are input into the phase interpolator $11_1$ are the clock CLK1 having a phase 0° and the clock CLK2 having a phase 45°. And, the clock CLK3 is input as the selection control signal into the interior division ratio selecting circuit $13_1$ as well, whereby the value of (a, b) of the phase interpolator $11_1$ at the time when the clock CLK1 having a phase 0° and the clock CLK2 having a phase 45° have been input is (7, 0). Thus, the clock that is output from the phase interpolator $11_1$ is the clock having a phase 0°.

Next, when the level of the clock CLK3 becomes high, the clock selecting circuit $12_1$ selects and outputs the clock CLK5. Further, on the other hand, the clock selecting circuit $12_2$ selects and outputs the clock CLK6.

Thus, at this time point, the clocks that are input into the phase interpolator $11_1$ are the clock CLK5 having a phase 180°, and the clock CLK6 having a phase 225° And, the clock CLK3 is input as the selection control signal into the interior division ratio selecting circuit $13_1$ as well, whereby the value of (a, b) of the phase interpolator $11_1$ at the time when the clock CLK5 having a phase 180° and the clock CLK6 having a phase 225° have been input is (3, 4). Thus, the clock that is output from the phase interpolator $11_1$ is the clock having a phase 225°.

Two clocks each having a different phase are output to the pulse generator $21_1$ from the phase interpolator $11_1$ at a required timing. Likewise, two clocks each having a different phase are output to each pulse generator from each phase interpolator as well, whereby the desired single-phase clock can be generated similarly to the case of the example 1 and the example 2.

Example 4

An example 4 will be explained.

The example 4 is characterized in that the components of the foregoing example 2 are provided for each circuit region that operates by a different clock.

Figure 19:
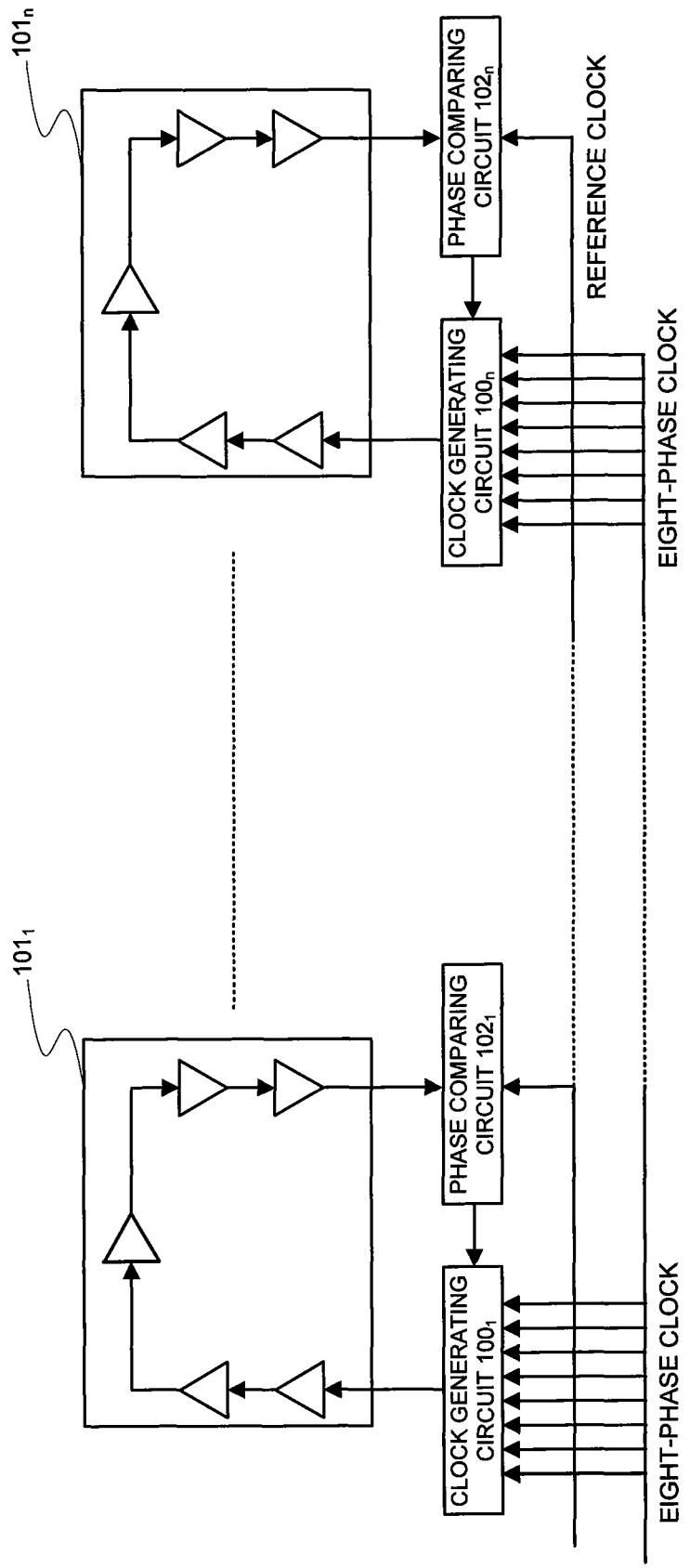
FIG. 19 is a view having a configuration of an example 4 illustrated.

FIG. 19 is a view having a configuration of the example illustrated. As shown in FIG. 19, a configuration is made so that one eight-phase clock is distributed as far as the clock generating circuits $100_1$ to $100_n$, each of which generates the clock required for each of the circuit regions $101_1$ to $101_n$.

Further, a configuration is made so that each of the phase comparators $102_1$ to $102_n$ compares the end-distribution clock of each of the circuit regions $101_1$ to $101_n$ with the reference clock, and each of the clock generating circuits $100_1$ to $100_n$ performs a phase correction so that the phase of end-distribution clock and that of the reference clock coincide with each other.

In accordance with this example, there exists the effect that the clocks required for each circuit region can be generated with the one multi-phase clock, and the phase adjustment with the reference clock can be implemented, and further, the circuit having a small size can be realized.

In addition, there exists the effect that employing the technology such as isometric wiring only for the reference clock of each circuit region to true up the timing between the clock converting circuit of each circuit region and that of the other enables the phases of the circuit regions to coincide with each other even though the timing at which the multi-phase clock is distributed to each circuit region does not coincide.

Example 5

An example 5 of the present invention will be explained.

The example 5 is a modification example of the foregoing example 4. In the example 4, a configuration was made so that one eight-phase clock was supplied for a plurality of the regions; however such a configuration causes the wiring pattern to become complicated, and further, leads to an increase in the circuit size. Thereupon, in the example 5, an example will be explained of the case that a master clock of a high frequency is supplied for each region, and is de-multiplied just before the clock generating circuit, thereby to obtain the multi-phase clock.

Figure 20:
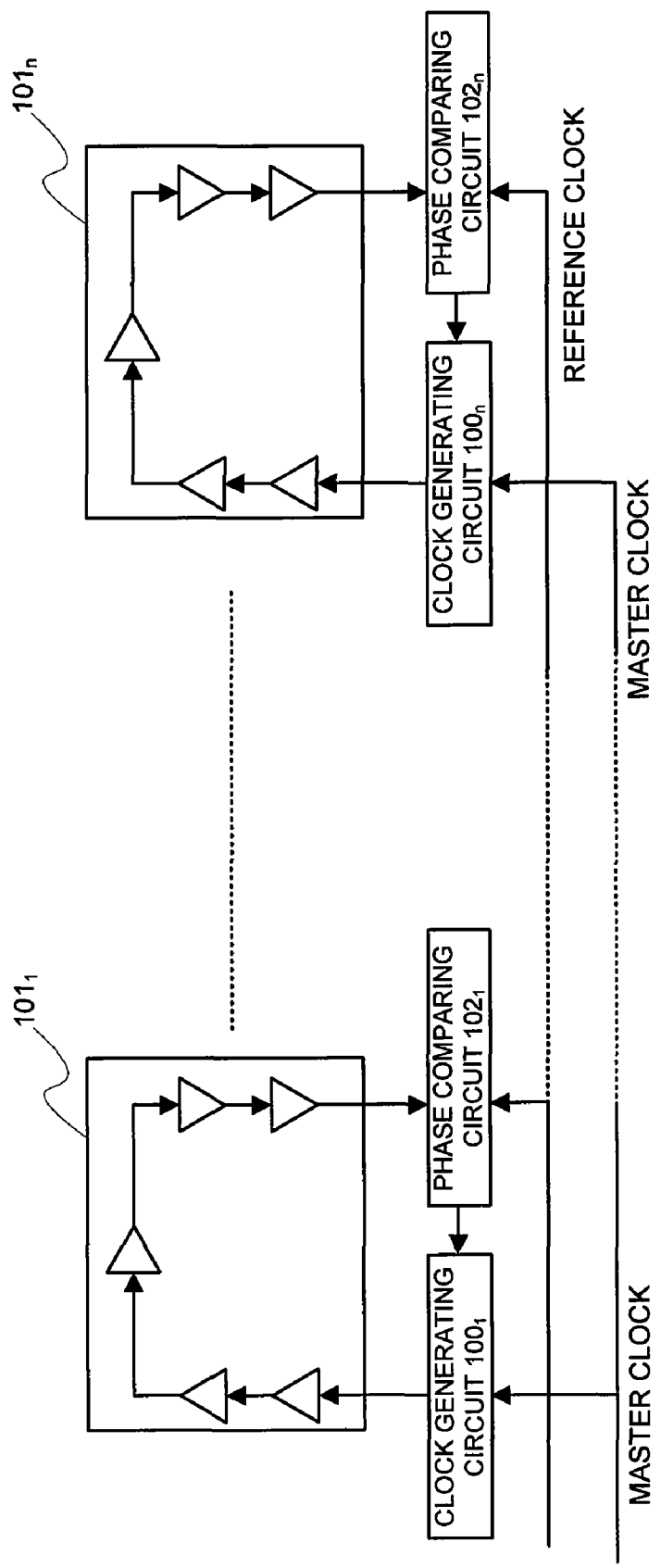
FIG. 20 is a view having a configuration of an example 5 illustrated.

FIG. 20 is a view illustrating a configuration of the example 5. As shown in FIG. 20, a configuration is made so that one master clock is supplied for the clock generating circuits $100_1$ to $100_n$, each of which generate the clock required for each of the circuit regions $101_1$ to $101_n$.

Figure 21:
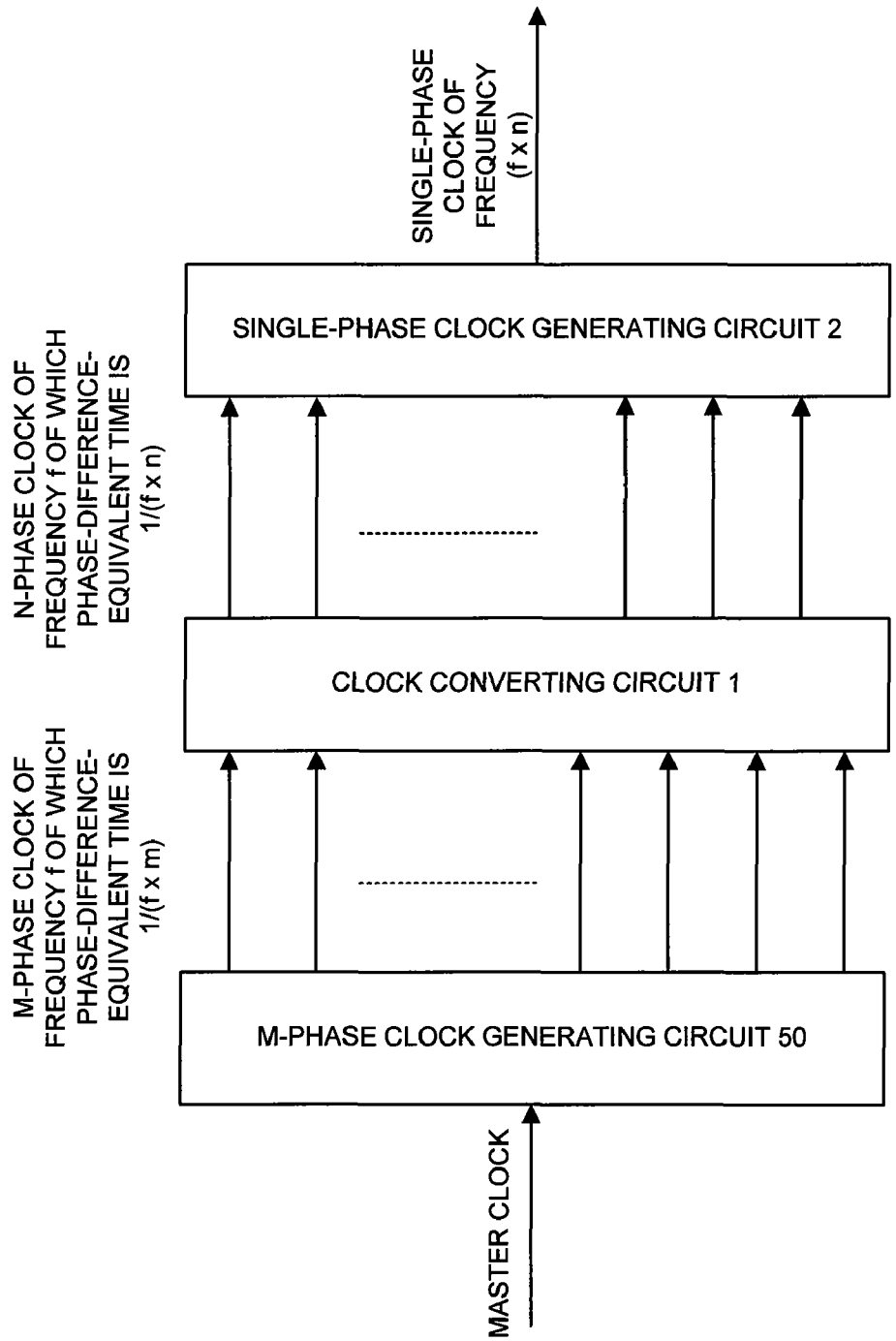
FIG. 21 is a view having a configuration illustrated of the clock generating circuit in the example 5.
Figure 22:
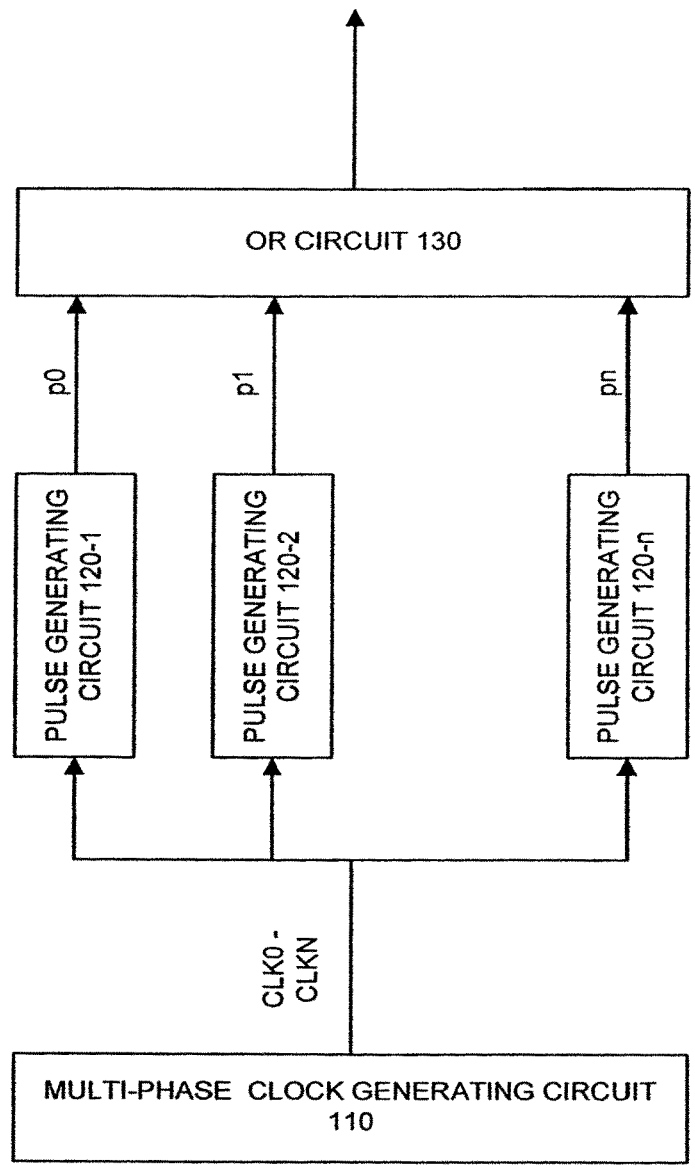
FIG. 22 is a view for explaining a prior art.

Each of the clock generating circuits $100_1$ to $100_n$, as shown in FIG. 21, includes an m-phase clock generating circuit 50 in the up-stream side of the clock converting circuit 1 for converting the m-phase clock into the n-phase clock. This m-phase clock generating circuit 50 generates the m-phase clock by de-multiplying the master clock, or the like.

The effect obtained by making such a configuration lies in a point of preventing a complexity in the wiring pattern and an increase in the circuit size due to supplying the multi-phase clock for a plurality of the regions, and as an additional effect, it does not take much labor and time to implement a timing adjustment between the master clock and the reference clock because the present invention has a function of the phase adjustment.

The single-phase clock that is supplied for each region is generated from the multi-phase clock obtained from the master clock. Thus, in a case where the timing of the master clock does not coincide with that of the reference clock, the timing lag of the single-phase clock and the reference clock might exist.

For this, it is necessary to cause the timing of the master clock and that of the reference clock to coincide with each other; however obtaining the multi-phase clock necessitates the master clock of which the frequency is higher than that of this multi-phase clock, whereby the technology such as isometric wiring is employed to adjust the timing with the reference clock of a low frequency, which makes the circuit design difficult.

The clock generating circuit of the present invention has a correction function of adjusting the timing with the reference clock, whereby a freedom degree of the circuit design can be secured without paying attention to the timing between the master clock and the reference clock.

In addition, there exists the effect that employing the technology such as isometric wiring only for the reference clock to true up the timing between the clock converting circuit of each circuit region and that of the other enables the phases of the circuit regions to coincide with each other even though the timing at which the master clock is distributed to each circuit region does not coincide.

The invention claimed is:

1. A clock generating circuit, comprising:
a clock converting circuit for converting an m-phase clock of a frequency f into an n-phase clock of a frequency f, wherein said clock converting circuit includes at least n phase interpolators, each said phase interpolator is configured to input two clocks of said m-phase clock each having a different phase, and to output a clock of a delay time that is specified by a time obtained on dividing a timing difference of said two clocks by a predetermined interior division ratio (a:b, a+b=n), thus making said interior division ratio variable; and
a single-phase clock generating circuit for employing at least one part of each clock of said n-phase clock, thereby to generate a single-phase clock signal.

2. The clock generating circuit according to claim 1, characterized in including a controlling circuit for controlling an interior division ratio, said controlling circuit being provided in said phase interpolator.

3. The clock generating circuit according to claim 2, characterized in that said controlling circuit is configured to control said predetermined interior division ratio so that a timing of a reference clock and that of said single-phase clock coincides with each other, based upon a time equivalent to a phase difference of the reference clock and the clock distributed in an end of the circuit for which said single-phase clock has been supplied.

4. The clock generating circuit according to claim 1, characterized in including a controlling circuit for controlling an interior division ratio, said controlling circuit being provided in said phase interpolator.

5. A clock generating circuit, characterized in including:
a clock converting circuit for converting an m-phase clock signal of a frequency f of which a phase-difference-equivalent time differs every $1/(f \times m)$ into an n-phase clock signal of a frequency f of which a phase-difference-equivalent time differs every $1/(f \times n)$; and
a single-phase clock generating circuit for generating a single-phase clock signal of a frequency $(f \times n)$ from said n-phase clock signal;
that said clock converting circuit includes m phase interpolators each of which is configured to input two clocks of the m-phase clock each having a different phase, and to output a clock of a delay time that is specified by a time obtained by dividing a timing difference of said two clocks by a predetermined interior division ratio (a:b, a+b=n), thus making said interior division ratio variable; and
that said single-phase clock generating circuit includes:
n pulse generators for producing pulses each of which does not overlap with the other at a timing of a rising or falling edge of the n-phase clock output from said clock converting circuit; and
a logical circuit for computing a logical sum of the pulses produced by said pulse generators to generate a single-phase clock of a frequency $(f \times n)$.

6. The clock generating circuit according to claim 5, characterized in including a controlling circuit for controlling an interior division ratio, said controlling circuit being provided in said phase interpolator.

7. The clock generating circuit according to claim 6, characterized in that said controlling circuit is configured to control said predetermined interior division ratio so that a timing of a reference clock and that of said single-phase clock coincides with each other, based upon a time equivalent to a phase difference of the reference clock and the clock distributed at an end of the circuit for which said single-phase clock have been supplied.

8. A clock generating method, characterized in
selecting n pairs from an m-phase clock, wherein each clock in each pair having a different phase;
generating a clock of a delay time that is specified by a time obtained on dividing a timing difference of the two clocks in each pair by a predetermined interior division ratio (a:b, a+b=n), thereby to generate an n-phase clock of a frequency f,
producing pulses in synchronism with a rising or falling edge of each clock of said n-phase clock,
computing a logical sum of these pulses, and
generating a single-phase clock of a frequency (f×n).

9. A clock generating circuit comprising:
a clock converting circuit for converting an m-phase clock signal of an identical frequency f of which a phase-difference-equivalent time differs every 1/(f×m) into an n-phase clock signal of an identical frequency f of which a phase-difference-equivalent time differs every 1/(f×n);
wherein said clock converting circuit includes at least n phase interpolators, each said phase interpolator is configured to input two clocks of said m-phase clock each having a different phase, and to output a clock of a delay time that is specified by a time obtained on dividing a timing difference of said two clocks by a predetermined interior division ratio (a:b, a+b=n), thus making said interior division ratio variable; and
a single-phase clock generating circuit for employing one part or all of said n-phase clock signal, thereby to generate a single-phase clock signal of a frequency (f×n)/A (A is a natural number).

10. A clock generating circuit, comprising:
a clock converting circuit for converting an m-phase clock signal of a frequency f of which a phase-difference-equivalent time differs every 1/(f×m) into an n-phase clock signal of a frequency f of which a phase-difference-equivalent time differs every 1/(f×n);
wherein said clock converting circuit includes at least n phase interpolators, each said phase interpolator is configured to input two clocks of said m-phase clock each having a different phase, and to output a clock of a delay time that is specified by a time obtained on dividing a timing difference of said two clocks by a predetermined interior division ratio (a:b, a+b=n), thus making said interior division ratio variable; and
a single-phase clock generating circuit for producing pulses each of which does not overlap with the other in synchronism with a rising or falling edge of said n-phase clock, selectin every (X+1)-th pulse out of these pulses, computing a logical sum of the selected pulses, and generating a single-phase clock signal of a frequency (f×n)/(X+1)(X is a natural number).

11. A clock generating circuit comprising:
a clock converting circuit for converting an m-phase clock signal of an identical frequency f of which a phase-difference-equivalent time differs every 1/(f×m) into an n-phase clock signal of an identical frequency f of which a phase-difference-equivalent time differs every 1/(f×n);
wherein said clock converting circuit includes at least n phase interpolators;
a controlling circuit for controlling an interior division ratio, said controlling circuit being provided in said phase interpolator; and
a single-phase clock generating circuit for employing one part or all of said n-phase clock signal, thereby to generate a single-phase clock signal of a frequency (f×n)/A (A is a natural number).

12. A clock generating circuit, comprising:
a clock converting circuit for converting an m-phase clock signal of a frequency f of which a phase-difference-equivalent time differs every 1/(f×m) into an n-phase clock signal of a frequency f of which a phase-difference-equivalent time differs every 1/(f×n);
wherein said clock converting circuit includes at least n phase interpolators,
a controlling circuit for controlling an interior division ratio, said controlling circuit being provided in said phase interpolator; and
a single-phase clock generating circuit for producing pulses each of which does not overlap with the other in synchronism with a rising or falling edge of said n-phase clock, selecting every (X+1)-th pulse out of these pulses, computing a logical sum of the selected pulses, and generating a single-phase clock signal of a frequency (f×n)/(X+1)(X is a natural number).

13. An integrated circuit, comprising:
at least one circuit board comprising an m-phase clock of a frequency f; and
a clock generating circuit, comprising:
a clock converting circuit for converting the m-phase clock into an n-phase clock of a frequency f;
said clock converting circuit includes at least n phase interpolators, wherein each of said phase interpolators is configured to input two clock signals of said m-phase clock, and to output a clock of a delay time that is specified by a time obtained on dividing a timing difference of said two clocks by a variable interior division ratio; and
a single-phase clock generating circuit for employing at least one part of each clock of said n-phase clock to generate a single-phase clock signal.

14. The integrated circuit of claim 13, further comprising a controlling circuit for controlling an interior division ratio, said controlling circuit being provided in said phase interpolator.

15. The integrated circuit of claim 14, wherein said controlling circuit is configured to control said predetermined interior division ratio so that a timing of a reference clock and that of said single-phase clock coincides with each other, based upon a time equivalent to a phase difference of the reference clock and the clock distributed in an end of the circuit for which said single-phase clock has been supplied.

16. An integrated circuit, comprising
at least one circuit board comprising an m-phase clock having a frequency f and a phase-difference-equivalent time difference of 1/(f×m); and
a clock converting circuit for converting an output signal of the m-phase clock into an n-phase clock signal of a frequency f of which a phase-difference-equivalent time differs every 1/(f×n); and
a single-phase clock generating circuit for generating a single-phase clock signal of a frequency (f×n) from said n-phase clock signal;
said clock converting circuit further comprising m phase interpolators, each of which is configured to input two clocks of the m-phase clock having a different phase, and to output a clock of a delay time that is specified by a time obtained by dividing a timing difference of said two clocks by a variable interior division ratio;

and said single-phase clock generating circuit comprises n pulse generators that produce pulses, wherein each pulse does not overlap with other pulses, and wherein each pulse is at a timing of a rising or falling edge of the n-phase clock output from said clock converting circuit;

and a logical circuit for computing a logical sum of the pulses produced by said pulse generators to generate a single-phase clock of a frequency (f×n).

17. The integrated circuit of claim 16, further comprising, a controlling circuit for controlling an interior division ratio, said controlling circuit being provided in said phase interpolator.

18. The integrated circuit of claim 17, wherein said controlling circuit is configured to control said predetermined interior division ratio so that a timing of a reference clock and that of said single-phase clock coincides with each other, based upon a time equivalent to a phase difference of the reference clock and the clock distributed at an end of a circuit supplied by said single-phase clock.

* * * * *